US011493545B2

(12) United States Patent
Beishline et al.

(10) Patent No.: US 11,493,545 B2
(45) Date of Patent: Nov. 8, 2022

(54) MEASUREMENT DEVICE AND METHOD OF ITS OPERATION

(71) Applicant: Setra Systems, Inc., Boxborough, MA (US)

(72) Inventors: Eric Christopher Beishline, Marlborough, MA (US); Been-Chyuan Lin, Boxborough, MA (US); Thomas Huntington Lish, Templeton, MA (US); Jeffrey Alan Herb, Litchfield Park, AZ (US); Hubertus Alexander Caris, Enschede (NL); Dion Hofste, Enschede (NL); Christian Peter Suurmeijer, Amersfoort (NL); Martinus Johannus Hannink, Almelo (NL)

(73) Assignee: SETRA SYSTEMS, INC., Boxborough, MA (US)

( * ) Notice: Subject to any disclaimer, the term of this patent is extended or adjusted under 35 U.S.C. 154(b) by 485 days.

(21) Appl. No.: 16/681,574

(22) Filed: Nov. 12, 2019

(65) Prior Publication Data
US 2020/0150163 A1 May 14, 2020

Related U.S. Application Data

(60) Provisional application No. 62/758,565, filed on Nov. 10, 2018.

(51) Int. Cl.
G01R 22/06 (2006.01)
H05K 5/02 (2006.01)
G01R 15/00 (2006.01)
H05K 5/00 (2006.01)
G01R 13/02 (2006.01)
G01R 19/165 (2006.01)
(Continued)

(52) U.S. Cl.
CPC ............ *G01R 22/065* (2013.01); *G01R 13/02* (2013.01); *G01R 15/00* (2013.01); *G01R 19/16528* (2013.01); *G01R 19/257* (2013.01); *G01R 19/2513* (2013.01); *H05K 5/0017* (2013.01); *H05K 5/0217* (2013.01); *H05K 5/0247* (2013.01)

(58) Field of Classification Search
None
See application file for complete search history.

(56) References Cited

U.S. PATENT DOCUMENTS 4,471,442 A * 9/1984 Douglas .................... B41J 2/22
  361/679.01
6,007,351 A * 12/1999 Gabrisko, Jr. ....... H05K 9/0018
  439/92

(Continued)

Primary Examiner — Xanthia C Cunningham
(74) Attorney, Agent, or Firm — Moreno IP Law LLC

(57) ABSTRACT

A measurement device, such as a power meter or power submeter, may comprise a frame disposed in a housing dividing an interior volume of the housing into a first volume and a second volume. An external power source is connected to the device in the first volume and the frame may serve as an insulative barrier between the first volume and an exterior it and the housing. The device may alternatively, or additional include, an user interface assembly that is configured to mounted in a same orientation regardless of an orientation of the device or housing of a device relative to the external power source.

25 Claims, 25 Drawing Sheets

(51) Int. Cl.
*G01R 19/25* (2006.01)
*G01R 19/257* (2006.01)

(56) References Cited

U.S. PATENT DOCUMENTS

| | | | | |
|---|---|---|---|---|
| 6,798,191 B1* | 9/2004 | Macfarlane | ............ | H05K 1/116 |
| | | | | 324/156 |
| 7,298,134 B2* | 11/2007 | Weikel | ................. | G01R 22/063 |
| | | | | 324/96 |
| 7,457,687 B1* | 11/2008 | Porter | .................. | A01G 25/165 |
| | | | | 239/69 |
| 8,015,873 B2* | 9/2011 | Hall | ....................... | G01R 35/00 |
| | | | | 73/431 |
| 8,379,376 B2* | 2/2013 | Nehete | ................... | G01R 22/06 |
| | | | | 361/678 |
| 8,547,686 B2* | 10/2013 | Pruehs | .................... | H02B 1/03 |
| | | | | 361/667 |
| 8,785,793 B2* | 7/2014 | Cox | ....................... | H05K 5/06 |
| | | | | 361/752 |
| 9,237,665 B1* | 1/2016 | Baldwin | ................. | H02G 3/20 |
| 9,678,485 B2* | 6/2017 | Malaugh | ................. | A01G 25/16 |
| 10,285,344 B2* | 5/2019 | Stange | ................... | G05B 15/02 |
| 10,485,113 B2* | 11/2019 | Dunn | ..................... | H05K 7/1488 |
| 10,701,819 B1* | 6/2020 | Yang | ...................... | H05K 5/0247 |
| 10,753,987 B2* | 8/2020 | McGee | ................... | G01D 11/24 |
| 10,917,979 B1* | 2/2021 | Paul | ....................... | H05K 5/0047 |
| RE48,999 E* | 3/2022 | Taylor, Jr. | ................. | G08B 5/36 |
| 2005/0269140 A1* | 12/2005 | Cox | ......................... | H05K 5/06 |
| | | | | 361/752 |
| 2005/0270016 A1* | 12/2005 | Karanam | ............... | G01R 22/10 |
| | | | | 324/157 |
| 2006/0030971 A1* | 2/2006 | Nelson | ................. | A01G 25/165 |
| | | | | 700/284 |
| 2006/0054335 A1* | 3/2006 | Rapp | ...................... | H05K 5/061 |
| | | | | 177/238 |
| 2006/0076944 A1* | 4/2006 | Weikel | ................. | G01R 21/133 |
| | | | | 324/156 |
| 2009/0045038 A1* | 2/2009 | Worones | ............... | G01R 15/002 |
| | | | | 200/11 DA |
| 2010/0073172 A1* | 3/2010 | Lax | ......................... | G08B 17/10 |
| | | | | 340/630 |
| 2010/0251827 A1* | 10/2010 | Bourbeau | ............ | H05K 5/0017 |
| | | | | 361/679.01 |
| 2010/0256788 A1* | 10/2010 | Bourbeau | ............ | H05K 5/0017 |
| | | | | 700/301 |
| 2013/0057408 A1* | 3/2013 | Aiken | ..................... | H02H 1/0023 |
| | | | | 702/58 |
| 2013/0294039 A1* | 11/2013 | Chao | ...................... | G06F 1/182 |
| | | | | 361/752 |
| 2016/0334076 A1* | 11/2016 | Dong | ...................... | F21V 9/00 |
| 2017/0034931 A1* | 2/2017 | Little | ...................... | H02S 40/30 |
| 2017/0344037 A1* | 11/2017 | Novotny | .............. | H05K 5/0017 |
| 2017/0346650 A1* | 11/2017 | Eom | ...................... | G07F 17/3223 |
| 2018/0228099 A1* | 8/2018 | Nickerson | .............. | A01G 25/16 |
| 2019/0219472 A1* | 7/2019 | Huang | ................... | G01L 27/005 |
| 2019/0329809 A1* | 10/2019 | Mackay | ................ | B60K 17/043 |

* cited by examiner

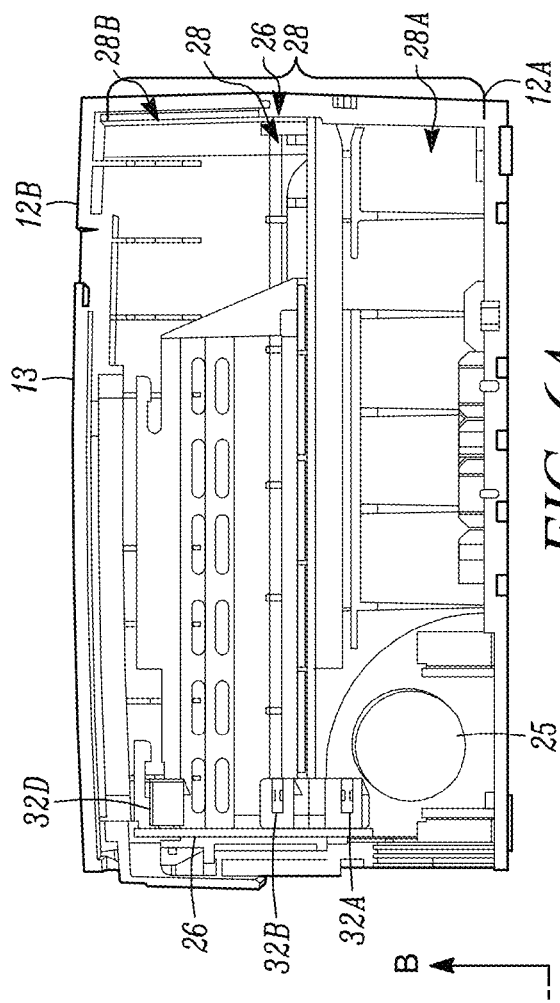
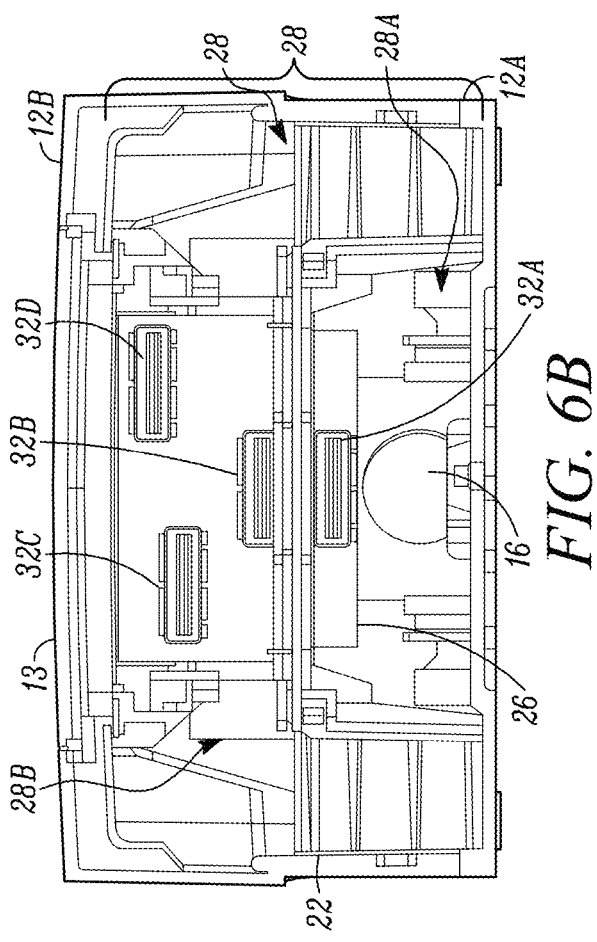
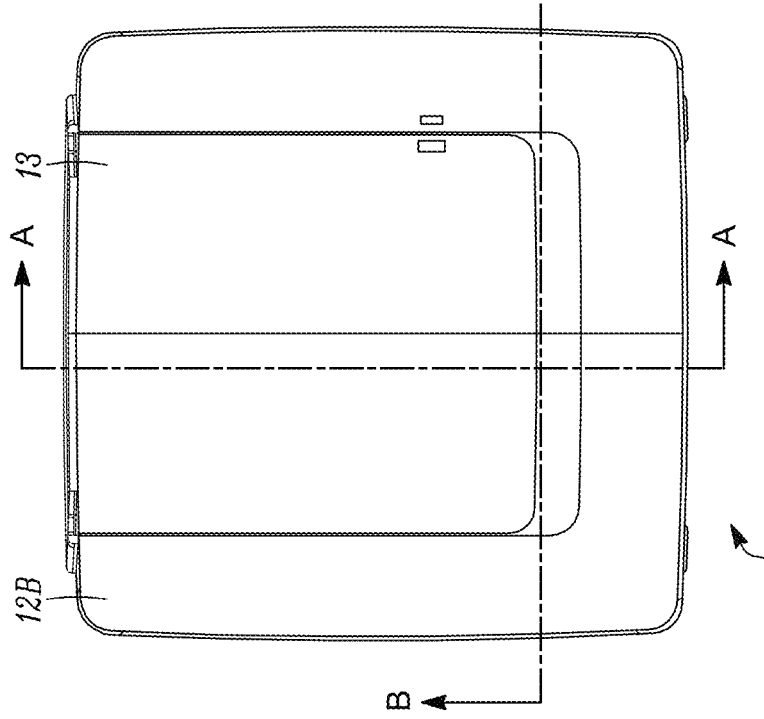

MEASUREMENT DEVICE AND METHOD OF ITS OPERATION

FIELD OF THE INVENTION

The present systems and methods relate generally to energy measurement, monitoring and, more particularly, to electrical submetering.

BACKGROUND OF THE INVENTION

Energy management is a growing practice among companies that operate large buildings, campuses, and other complex facilities. Successful energy management requires detailed information on how energy is used. Electrical submetering involves the installation of power meters (also called power monitors, electrical meters, or energy monitors) that can measure energy usage after the primary utility meter. Submetering offers the ability to monitor energy usage for individual tenants, departments, pieces of equipment or other loads to account for their actual energy usage.

The benefits of submetering are numerous. For example, submetering enables accurate energy monitoring, real-time energy consumption, granular in-depth review of facility energy data, better information to make decisions to help optimize energy performance, the ability to record actual energy usage, comparison of usage across similar facilities over time, identifying and eliminating wasted energy, early access to maintenance issues for repair before critical equipment failure, as well as other advantages.

Typical exemplary applications of submetering include peak demand management, tenant submetering, and energy cost allocation. Submeters used for peak demand management allow the end-user to receive detailed consumption information, which allows the customer to avoid cost increases with time-of-usage billing and to take advantage of off-peak rates. Tenant submetering allows each tenant to be billed only for the energy consumed within the rented space. Finally, submetering gives the user the ability to monitor individual pieces of equipment so that energy costs can be allocated to different departments and processes. By using this data, building managers have a better understanding of who is using the most energy and where it's being used so corrective actions may take place.

Presently known power meters range in number of circuits that can be monitored from three to as many as forty-eight in one device. Current transformers (CT) are connected to the load that is to be monitored. CT's can be hard- or soft-core clamp on-devices or Rogowski coil technology. Loads can range widely in the case of input voltages (90-600 VAC) to the meter as well as the range of current being measured (5-1000 Amps). Power meters come with some form of configuration either on the meter itself or with a companion software package typically loaded on a personal computer or laptop. The meters can be mounted as standalone product on the wall or within a rated enclosure as long as the final mounting methods meet applicable electrical and safety codes that are established by local, state or country requirements. Power meters are generally network enabled with communication protocols including BACnet and Modbus as dominant communication protocols in our served market (Building automation and control markets).

Although existing power meters enable effective submetering functionality, they also have limitations that reduce their usefulness or make them relatively hard to use. For example, many power meters, especially those of relative low circuit density (3-12 load circuits) require the product to be mounted in a separate enclosure to meet code. This is expensive for the installer and many times blocks on-board displays.

Another disadvantage is that on-board displays are in fixed orientation relative to the meter. If the meter is mounted in an orientation that is not in line with the display, it is difficult to read. For example, if the meter is mounted 90 degrees counterclockwise to its preferred orientation accommodate a particular mounting space, the end customer would need to clock his/her head 90 degrees in order to read the meter. Still another disadvantage is that configuration of the power meter using remote located software is typically cumbersome and non-intuitive.

Still another disadvantage is that due to code restrictions, most power meters in the market cannot be accessed once they are configured and installed without significant personal protective equipment (PPE) such as arc flash suits. To access the power meter with a USB cable to change a configuration or access stored data (logged data), the power in the facility that is being monitored needs to be turned off. This means parts of the building, equipment, etc. is de-energized, which can result in lost productivity and increased cost incurred by the customer. Data can be obtained over hard wired or wireless network communications, but not via USB or other temporary connection.

A further disadvantage is that a high-density power meter can be configured in many ways depending on the installation. For example, there may be multiple supply voltages (V1=480 VAC, V2=120 VAC for example) and loads may consist of one, two or three phases and in multiple service types (e.g. Wye or Delta). Some manufacturers use the concept of "elements" to group loads. However, if an element is less than three phases, keeping track of the CT, Vin and Element is confusing.

Another disadvantage is that several power meters today indicate an error condition by visual indication. However, some are very confusing as to the type of error, error code and what is needed to diagnose the error. This is especially true during initial installation and commissioning of the power meter. For example, when an error condition occurs, such as loss of load, there are few methods of setting alarm states or otherwise informing the end user of the error condition.

Still another disadvantage is when a user who configures the meter may not be the same individual as the electrician who installed the meter. In this case, it is difficult to have records that show 'how configured' vs. 'how installed'. Similarly, CT's connected to the power meter are not auto configured and require a user to configure them.

Finally, although most power meters provide some data logging, accessing the data is difficult and does not provide on-display snapshots of key energy usage by load.

BRIEF DESCRIPTION OF THE DRAWINGS

A more particular description of the invention briefly described above will be rendered by reference to specific embodiments thereof that are illustrated in the appended drawings. Understanding that these drawings depict only typical embodiments of the invention and are not therefore to be considered to be limiting of its scope, the embodiments of the invention will be described and explained with additional specificity and detail through the use of the accompanying drawings in which:

FIG. 6 is a top view of the measurement device

FIG. 6A is a sectional view of the measurement device taken along line C-C of FIG. 5 and omitting internal components.

FIG. 6B is a sectional view of the measurement device taken along line D-D of FIG. 5 and omitting internal components.

DETAILED DESCRIPTION OF THE DRAWINGS

Figure 1:
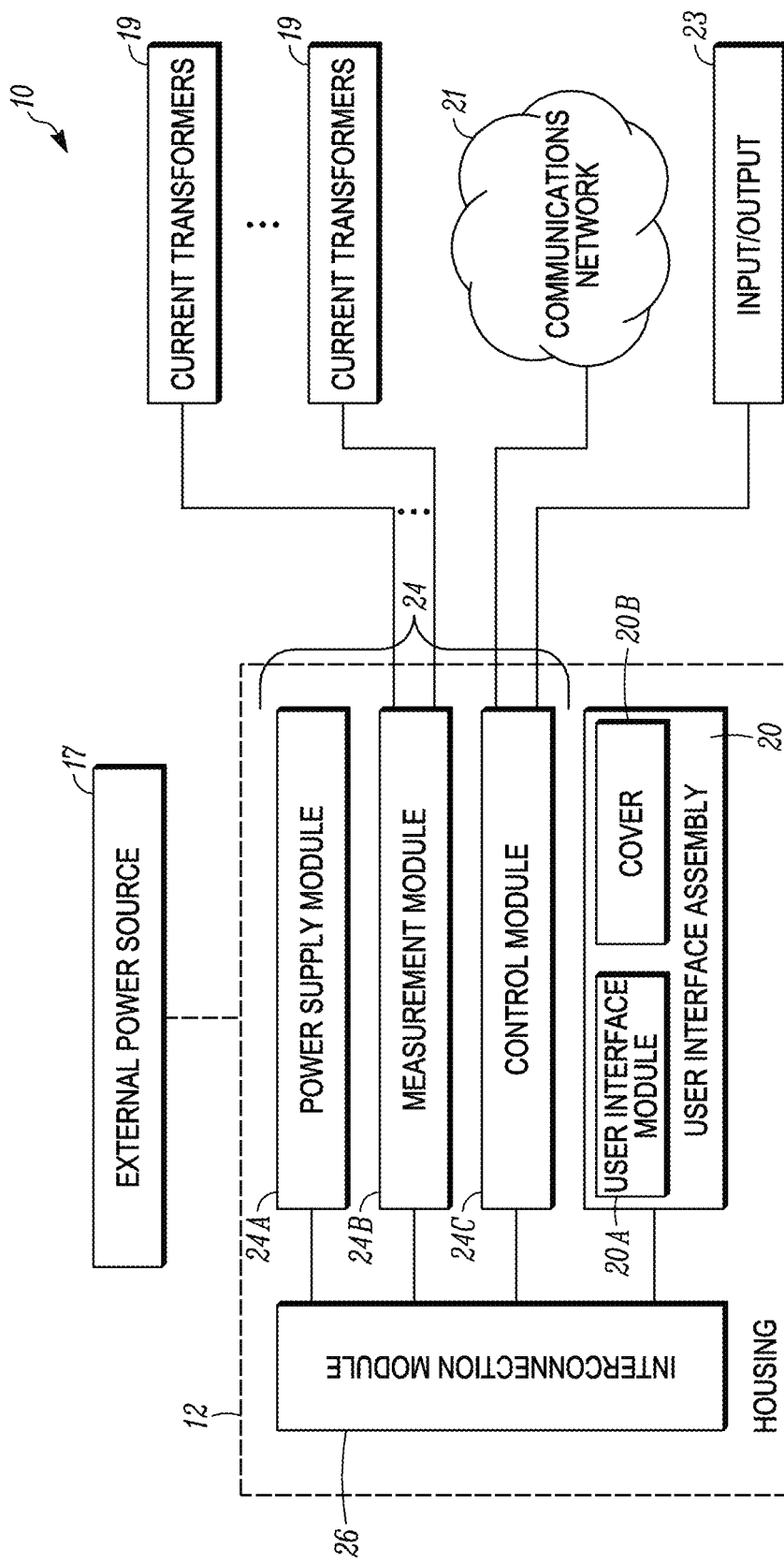
FIG. 1 is a schematic illustration representing various embodiments of a measurement device according to aspects of the invention.

To provide an improved measurement device or power metering system and method, and to overcome the disadvantages and problems of currently available devices, there is provided a measurement device having among other features, improved operating capabilities, enhanced reliability, increased ease of configuration and use, improved safety, and easy repair. The new and novel measurement device described herein provides many installation and troubleshooting advantages over other meters available in a small form factor.

The measurement device provides real-time data to building managers, owners and energy reduction professionals to manage their overall energy consumption and cost within their facility. Applications include measurement and verification, tenant submetering, demand response and energy allocation in installations in hospitals and healthcare facilities, industrial and manufacturing plants, universities and educational facilities, retail and commercial buildings, data centers and electrical vehicle charging stations, to only name a few.

A particular advantage of the power meter is the ability of the installer to mount the unit in any orientation to accommodate field wiring or keypad access in the electrical room in a building. Another advantage is the easy to use and intuitive user interface of the remote located software. A further advantage is a configurable multi-function alarm indicator. The alarm indicator may be an audio/visual alarm (i.e. speaker or lights) that can be viewed on a status information report at the power meter itself. As a non-limiting example, when an alarm is configured on the unit and the alarm becomes active, a single light emitting diode (LED) will change state from green to red/blinking red. In addition to, or instead of, when the alarm becomes active, a relay on the measurement device may change state. As another example, if the alarm is defined for an under-voltage condition, and the voltage into the unit falls below that low voltage threshold, the alarm is active. The LED on the front display changes from red to green and the relay changes from a normally open state to a closed state. In addition to both of these options (audio/visual and relay), the display has text informing the user of what alarm has been activated. In the example above, the text on the display would inform the user that the alarm for low voltage has been activated.

Still another advantage is the availability of data relating to a selectable load found by navigating through log data. An additional advantage is the ability to detect mis-wiring and/or to automatically redefine the wired inputs to ensure correct functioning of the presently described new and novel device, without having to re-wire the mis-wired inputs. As a non-limiting example, one of the alarms can be configured to detect a negative current on a current input (described in more detail below). If the current flow through a connected current transformer 19 (and to a current input) is negative, the alarm is activated. In this case, the user could change the polarity of the wiring for that current input. An alternative for doing this mechanically is to change the polarity for that current transformer as described in more detail below.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements at the time of this writing. Furthermore, unless otherwise clear from the context, a numerical value presented herein has an implied precision given by the least significant digit. Thus, a value 1.1 implies a value from 1.05 to 1.15. The term "about" is used to indicate a broader range centered on the given value, and unless otherwise clear from the context implies a broader range around the least significant digit, such as "about 1.1" implies a range from 1.0 to 1.2. If the least significant digit is unclear, then the term "about" implies a factor of two, e.g., "about x" implies a value in the range from 0.5x to 2x, for example, about 100 implies a value in a range from 50 to 200. Moreover, all ranges disclosed herein are to be understood to encompass any and all sub-ranges subsumed therein. For example, a range of "less than 10" for a positive only parameter can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

Referring to FIG. 1, a measurement device 10, such as a power submeter, is shown schematically including electrical components for monitoring an external power source 17, and components for processing and storing data associated with power source voltage and/or current. As shown, an external power source 17 is electrically connected to one or more electronic modules, 20A, 24 and 26, which are mounted within housing 12. In some embodiments, the measurement device 10 may be connected to an external power source 17 through a plurality of voltage inputs. In an embodiment, the electronic modules 24 include a power supply module 24A, a measurement module 24B, and a control module 24C.

In addition, a user interface assembly 20 may comprise a user interface module 20A in signal communication with the control module 24C for displaying data or information based on processing performed by the control module 24C. To that end, an interconnection module 26, as described in more detail provides electrical connections between one or more of the above-referenced electronic modules 20A and 24A-24C.

As further represented in FIG. 1, one or more of the electronic modules 24A-24C are in electrical communication with current transformers 19 for purposes of monitoring power usage as known to one skilled in the art. In some embodiments, the measurement device 10 may be connected to a plurality of current transformers 19 through a plurality of current inputs. The measurement device 10 may include electronic circuitry and software whereby the measurement device 10 may transmit and receive information from and to the communications network 21 for transmission or receipt of information/data as necessary for the operation of the measurement device 10. In addition, an input/output connection 23 may be provided for transmission or receipt of electrical signals of or relating to external device such as audio/visual alarms. In other embodiments still, the measurement device 10 may interface with other devices through the general-purpose inputs/outputs connection 23 including, but not limited to, with other devices and sensors. As a non-limiting example, a 2 or 3 pin connector for RS485 communication or an ethernet RJ45 connector. To that end, the measurement device 10 may be programmed or configured for communication according to one or more protocols such as Modbus RTU, Modbus TCP/IP, BACnet MSTP or BACnet IP. In other embodiment, the inputs/outputs connection 23 may be at least one of a parallel port, a serial port, and a universal serial bus (USB) port.

As it will be described in more detail in the discussion of FIGS. 13-18 below, the measurement device 10 may receive and store a plurality of voltage characteristics 1304 and a plurality of current characteristics 1604 corresponding to a plurality of voltage inputs and a plurality of current inputs, respectively. In some embodiments, the voltage characteristics 1304 may include at least one of an expected voltage 1306 and an input configuration 1308. In still other embodiments, the input configuration 1308 may include at least one of a 4-wire wye configuration, a 3-wire delta configuration, a 4-wire delta configuration, a 3-wire single phase configuration, and a 2-wire single phase configuration. In other embodiments, the current characteristics 1604 may include at least one of a current transformer type 1606, a rated current 1608, a voltage at rated current 1610, a phase correction 1612, and a polarity correction 1614.

Figure 2:
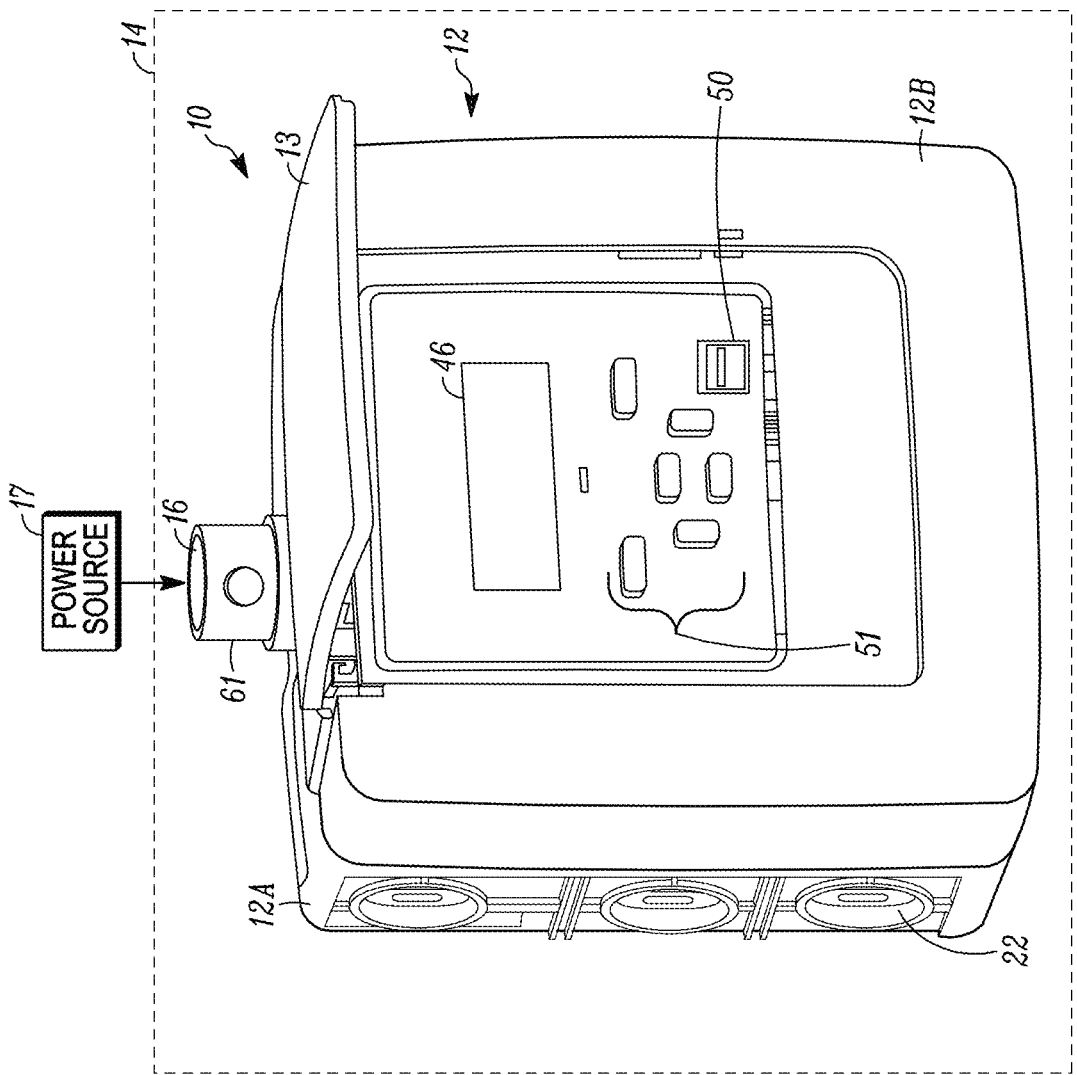
FIG. 2 is a perspective view of an embodiment of a measurement device according to aspects of the invention.
Figure 2A:
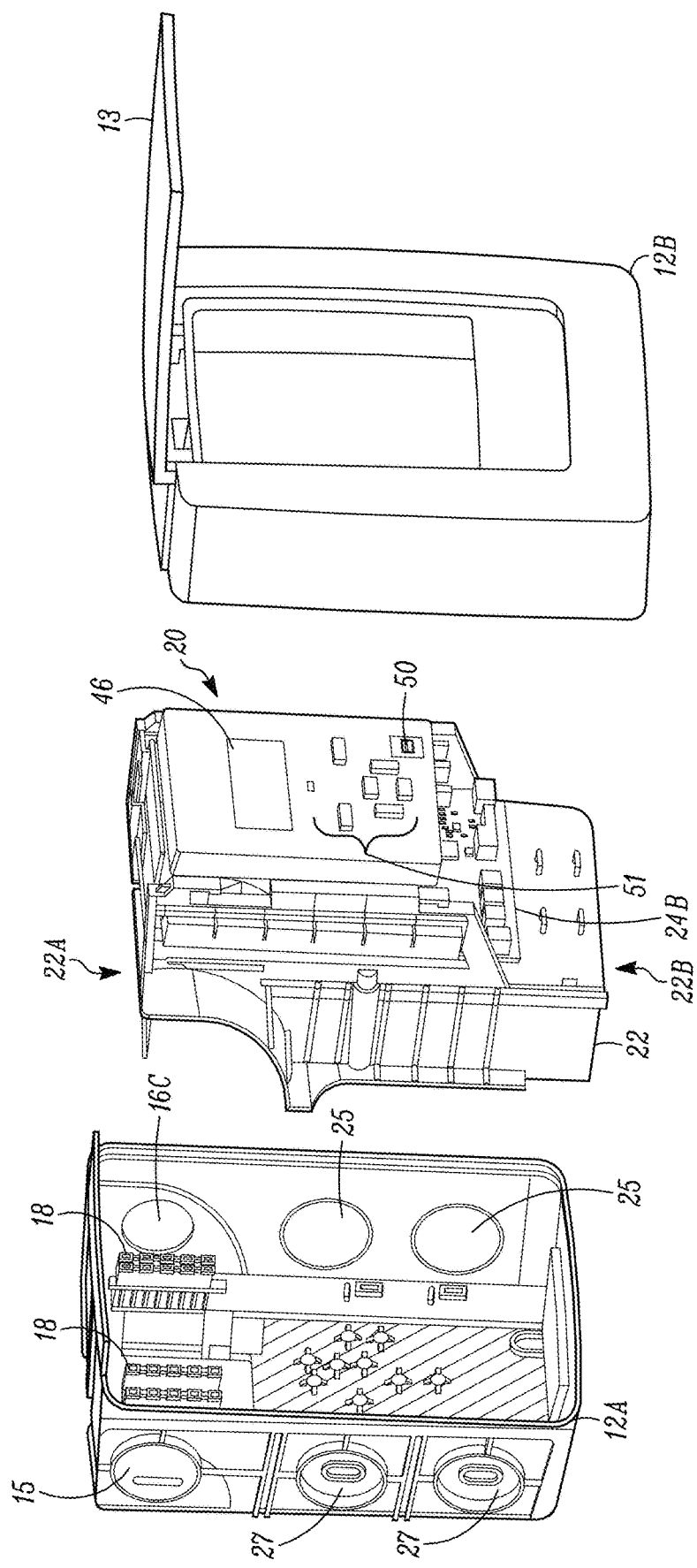
FIG. 2A is a perspective exploded view of the measurement device of FIG. 1
Figure 3:
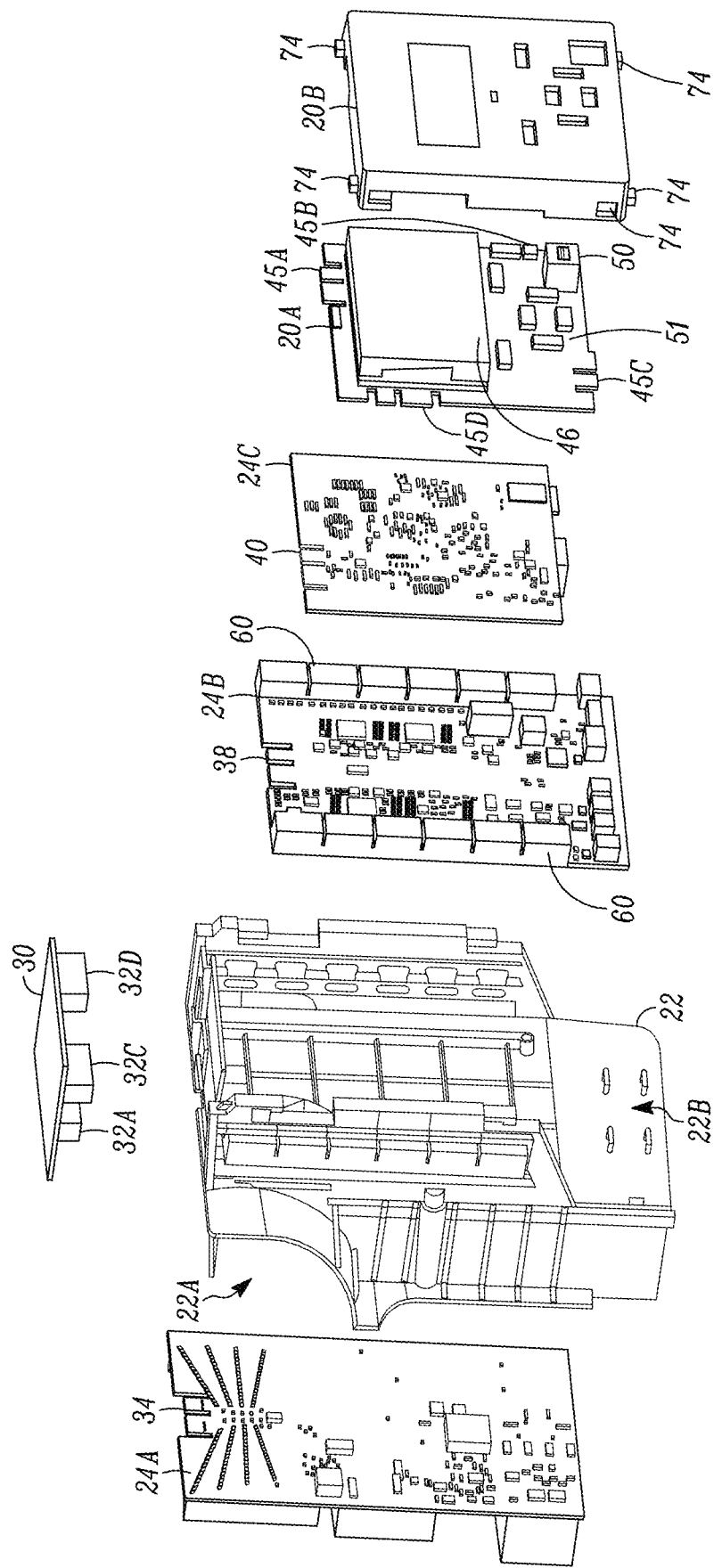
FIG. 3 is a perspective exploded view of the user interface assembly in accordance with aspects of the invention.

With respect to FIGS. 2, 2A and 3, the arrangement of components of the measurement device 10 are shown in more detail. More specifically, the measurement device 10 may include a housing 12 that comprises a back housing 12A and a front housing 12B, which is operatively connected to the back housing 12A. Together the back housing 12A and front housing 12B define an interior volume 28 (FIGS. 6A and 6B) in which electrical components are mounted for monitoring power in embodiments for a sub-metering device. As further shown, the measurement device 10 may comprise a dust cover 13 pivotally mounted to the front housing 12B to access a communication port 50, input mechanism 51 (e.g. keypad) and/or a display screen 48.

The back housing 12A is configured to be mounted to a support structure 14 adjacent to the external power source 17. For example, the measurement device 10 may be mounted to a wall or DIN-rail. As shown, the back housing 12A preferably includes a at least one 16 for receiving conduits and power lines and through which the power lines (not shown) access the interior volume 28 of the housing 12 to first connections 18 (FIG. 2A) mounted to the back housing 12A.

First plugs 15 may be provided to seal the interior volume 28 and the connection between the external power source 17 and measurement device 10 at the first connections 18, in instances when one or more of the openings 16A-16C are not used for connection to the external power source 17. As further shown in FIG. 2A, the back housing 12A may comprise one or more second openings 25 for input of current transform lines (not shown). Second plugs 27 may be used to seal the interior volume 28 when the second openings 25 are not functioning for connection of the current transformers 19.

The opening 16 is disposed on a respective corresponding side of the back housing 12A so the device can be mounted in an upright position for access to external power source 17 lines regardless of the position of conduits and/or power lines relative to the housing 12. As will be explained in more detail below, the user interface assembly 20 of the measurement device 10 may be positioned and mounted relative to the measurement device 10 to always be in a same orientation or always in an upright position, regardless of the orientation of back housing 12A.

As mentioned above, the measurement device 10 further includes a user interface assembly 20 in electrical communication with the control module 24C and/or the external power source 17. The user interface assembly 20 is affixed to a base frame 22 as shown for example in FIG. 2A. In reference to FIGS. 1 and 3, the one or more electronic modules 24 are mounted to the base frame 22 and may be configured to provide various electronic functions such as power supply, memory, control and measurement functions, for example. In the embodiment shown in FIG. 3, the power supply module 24A, a measurement module 24B and a control module 24C are illustrated in alignment for mounting to the base frame 22. In addition, the user interface module 20A may be provided as a component of the user interface assembly 20

In an embodiment, the power supply module 24A converts the external voltage of the external power source 17 to a usable voltage by the other modules. In an embodiment, the power supply module 24A may be a switching power supply or a linear power supply and may include AC (alternating current) or DC (direct current) inputs as well as AC or DC outputs. As it may be appreciated by those skilled in the art, the power supply module 24A may comprise electronic circuitry including but not limited to resistors, capacitors, inductors, diodes, light-emitting diodes (LEDs), thyristor, triacs, microprocessor, transformers, relays, transistors, fuses, circuit breakers, switches, and a combination thereof to conform an electronic circuit capable of converting an input voltage to an output voltage.

The measurement module 24B may comprise hardware to sense and measure a physical property of an electrical signal. As a non-limiting example, the measurement module 24B may detect at least one of a voltage, a current, a resistance, an impedance, and a capacitance of an electrical signal. In some embodiments, the measurement module comprises a processor, a memory, and application specific integrated circuits (ASIC). In those embodiments, the processor may read instructions and information from the memory, then the processor interacts with the ASICs which in turn interact with electronic circuitry to detect or measure the physical property of the electric signal.

In a non-limiting embodiment, the measurement module 24B may further comprise current transformers inputs for connecting externally located current transformers for measuring the current flowing through a medium, such as an electrical conductor. The current transformers inputs may be an electrical connector. As it may be appreciated by those skilled in the art, in other embodiments, the current transformers may be located on the measurement module 24B itself and the medium may be routed through the measurement module. The measurement module may also comprise electronic circuitry including but not limited to resistors, capacitors, inductors, diodes, light-emitting diodes (LEDs), transformers, relays, transistors, fuses, circuit breakers, switches, and batteries to perform a variety of functions.

While embodiments of the measurement device 10 are discussed in further detail below, the control module 24C may comprise at least one of a processor, a memory, application specific integrated circuits (ASIC), and a communications interface. In some embodiments, the memory, such as a random-access memory (RAM), read only memory (ROM), a non-volatile (persistent) storage device, such as a magnetic disk, optical disk, solid-state storage or FLASH-EPROM, or other dynamic storage device, stores information including computer instructions. The memory is also used by the processor to store temporary values during execution of the computer instructions. In yet some other embodiments, the application specific integrated circuit (ASIC) is configured to perform operations not performed by processor. Examples of application specific ICs include graphics integrated circuits for generating images, cryptographic boards for encrypting and decrypting messages sent over a network, speech recognition, and interfaces to special external devices, such as visual and auditory alerts systems or equipment that repeatedly perform some complex sequence of operations that are more efficiently implemented in hardware. In other embodiments, the communication interface provides a communication coupling to a variety of external devices or a communications network to which a variety of external devices with their own processors are connected. For example, communication interface may be a parallel port or a serial port or a universal serial bus (USB) port. In some embodiments, communications interface is an integrated service digital network (ISDN) card or a digital subscriber line (DSL) card or a telephone modem that provides an information communication connection to a corresponding type of telephone line. In some embodiments, a communication interface is a cable modem that converts signals on bus into signals for a communication connection over a coaxial cable or into optical signals for a communication connection over a fiber optic cable. As another example, communications interface may be a local area network (LAN) card to provide a data communication connection to a compatible LAN, such as Ethernet. As another example, communications interface may be a modulator-demodulator (modem) to provide a wireless link to other devices capable of receiving information wirelessly. As another example, communications interface may be an RS-485 (modem) to provide a communication link to other devices using the same protocol. The control module may also comprise electronic circuitry including but not limited to resistors, capacitors, inductors, diodes, light-emitting diodes (LEDs), transformers, relays, transistors, fuses, circuit breakers, switches, and batteries to perform a variety of functions.

The user interface assembly 20 may comprise a user interface module 20A and an interface cover 20B. The user interface module 20A may further comprise sensors to detect an input from a user. As a non-limiting example, the user interface module 20A may comprise at least one of a microphone, an accelerometer, a camera, a button, a dial, a mouse, a trackball, and a keyboard. The user interface module 20A may also comprise a display device 46, such as a cathode ray tube (CRT) or a liquid crystal display (LCD), an OLED (Organic Light-Emitting Diode), and an AMO-LED (Active-Matrix Organic Light-Emitting Diode) for presenting images. As may be appreciated by those skilled in the art the display device 46 may be a touch-screen combination that acts as a display and a sensor. The user interface module 20A may also comprise electronic circuitry including but not limited to resistors, capacitors, inductors, diodes, light-emitting diodes (LEDs), transformers, relays, transistors, fuses, circuit breakers, switches, and batteries to perform a variety of functions.

While the embodiments described herein include the electronic modules 24A-24C, and user interface module 20A, the invention is not so limited and may comprise embodiments having fewer or more electronic modules, and electronic modules may be mounted entirely on the first side 22A or second side 22B of the base frame. To that end, multiple of the modules 24A-24C, 20A may be incorporated into fewer modules for example, the measurement module 24B and control module 24C may be incorporated as a single module.

In an embodiment, the power module 24A is affixed to a first side 22A of the base frame 22, wherein the first side 22A of the base frame 22 faces the back housing 12A. The measurement module 24B, control module 24C and the user interface assembly 20, including the user interface module 20A are connected to the base frame 22 on a second side 22B of the base frame 22 that faces the front housing 12B. Accordingly, and as shown in FIGS. 4, 5, 5A and 5B, the base frame 22 preferably has tabs, ledges, surfaces, detents etc. that may support the modules 24A-24C, 20A and the user interface assembly 20 on the base from 22. To that end, and as described in more detail below, an interconnection module 26 including connectors 30 and 32A-32D (FIGS. 6, 6A and 6B) to electrically connect the electronic modules 24A-24C and 20B according to their electronic configurations.

Again, in reference to FIGS. 6, 6A and 6B, the measurement device 10 is shown in sectional views without certain internal components to better describe features of embodiments of the invention. In one aspect the back housing 12A and front housing 12B together, at least when the front housing 12B is in a closed position relative to the back housing 12A, form an interior volume 28 within the housing 12. The base frame 22 divides the interior volume 28 into a first volume 28A adjacent the back housing 12A and a second volume 28B adjacent to the front housing 12B. As further shown in FIGS. 6A and 6B, the connector 32A of the interconnection module 26 is disposed within the first volume 28A, and one or more second connectors 32B, 32C, and 32D are disposed in the second volume 28B adjacent to the front housing 12B.

With respect to FIG. 3, the power module 24A includes a connector 34, also referred to as an edge connector, that is fixed in mating relationship with the female connector 32A in the first volume 28A or on the first side 22A of the base frame 22. In addition, ledges 36 (FIG. 5B) on the first side 22A of the base frame 22 support the power module 24A on the first side 22A of the base frame 22. Similarly, the measurement module 24B includes a connector 38 that fits in mating relation to second female connector 32B, and control module 24C includes connector 40 that fits in mating relation to third female connector 32C. In addition, ledges 42, 44 on the second side 22B of the base frame 22 support the measurement module 24B and control module 24C respectively on the second side 22B of the base frame 22.

As described above, the user interface assembly 20 may include an electronic module referred to as the user interface module 20A that is in electrical communication with the control module 24C. The user interface module 20A includes a plurality of connectors 46A-46D axially spaced along a periphery of the user interface module 20A, wherein each connector 46A-46D may be fitted in mating relation to the fourth female connector 32D in the second volume 28B of the measurement device 10 depending on the orientation of the user interface assembly 20 relative to the back housing 12A or relative to the interconnection module 26. Ledges 47 further support the user interface assembly 20 on the base frame 22.

As further shown in FIG. 2, the user interface module 20A preferably includes a display device 46 for displaying and viewing data or information relative to power measurements generated by the measurement device 10. An input mechanism 51, which may include an array of keypads, is also provided for entry of input commands for operation of the measurement device 10. In addition, a communication port 50, such as a USB port, is mounted on the user interface module 20A in a manner to face an exterior of the housing 12 so the communication port 50 is accessible from the exterior to the housing 12, when the front housing 12B is in a closed position relative to the back housing 12A. To that end, the user interface assembly includes a cover 20B that is affixed to the user interface module 20A and includes an opening 52 through which the communication port 50 is accessible.

The USB port 50 is mechanically isolated from the high voltage. Ideally this port is compliant with the required electrical safety codes (e.g. NEC) to allow access for meter configuration and data download. For known devices, when the power meter is installed and configured, and the utility main power is on, connecting the USB cable to the device to either configure or download stored data is unsafe. As such, the power to the facility must be turned off prior to connecting to the USB port, which is a disruptive process. However, in the novel power meter described herein, the power meter is configured such that the USB port may be used even when the main power is on. For example, the user may flip up the lid on the front of the unit that exposes the USB port. Without any further action, the USB cable may be connected to the port and remain compliant with the NEC, either where the device is installed or in a safe remote environment. Alternatively, the display in this case may simple be removed from the housing and then connected to a computing device via the USB port 50.

The above-described modular configuration of the base frame 22, electronic modules 24A-24C and user interface assembly 20 facilitate a safe and efficient installation or removal of the base frame 22 relative to the back housing 12A. For purposes of installation, in a first step one determines the orientation of the back housing 12A relative to an orientation of the external power source 17 and mounts the back housing to the support structure, which as described above may be for example a wall or a DIN-rail. In a second step, the power source via a power line is linked to the at least one first connections 18 using known tools, fixtures or adaptors. By way of example, chase nipples 61 may be mounted to the back housing 12A to receive one or more power conduits and/or lines.

Figure 4:
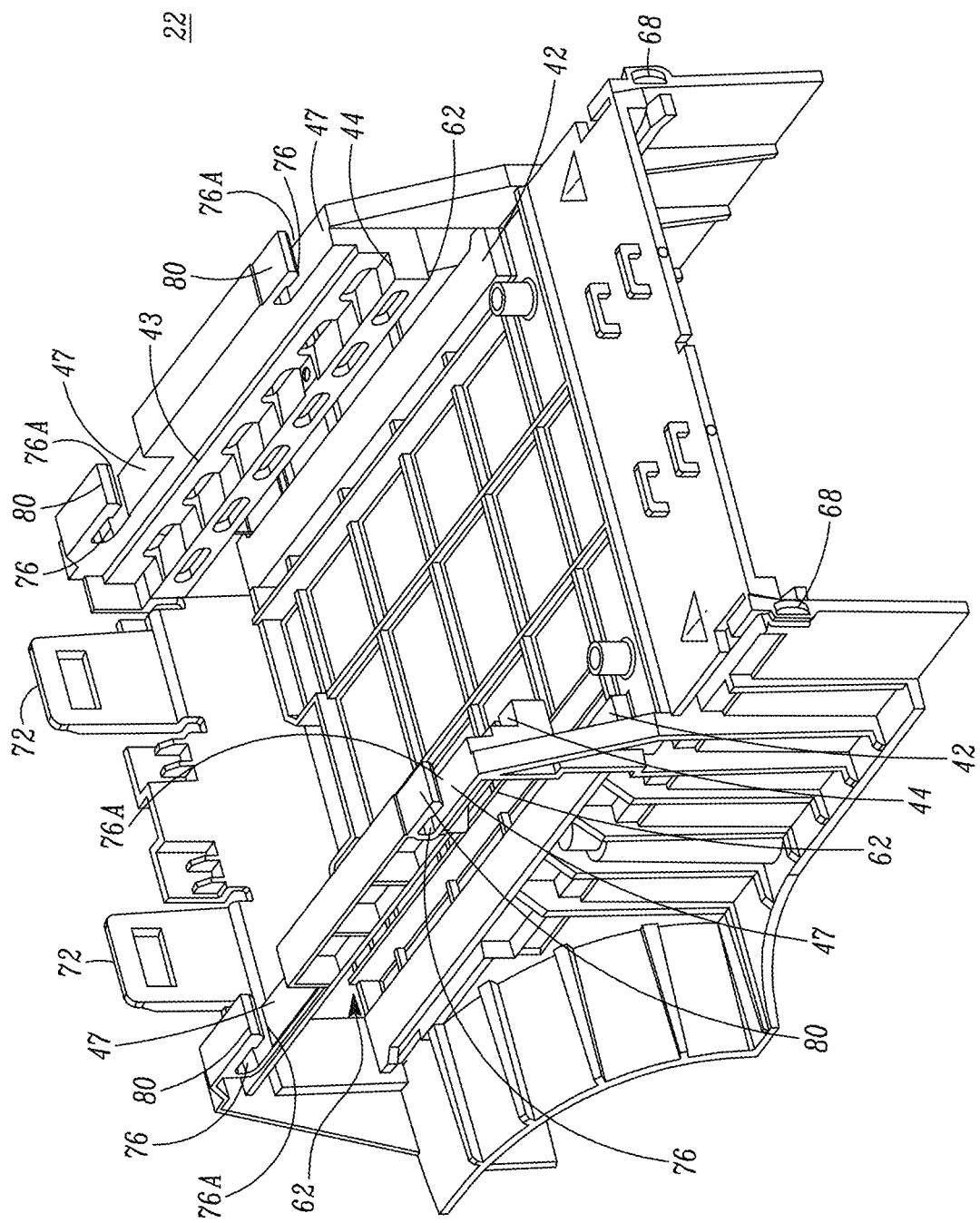
FIG. 4 is a perspective view of a base frame of the measurement device in accordance aspects of the invention.
Figure 5A:
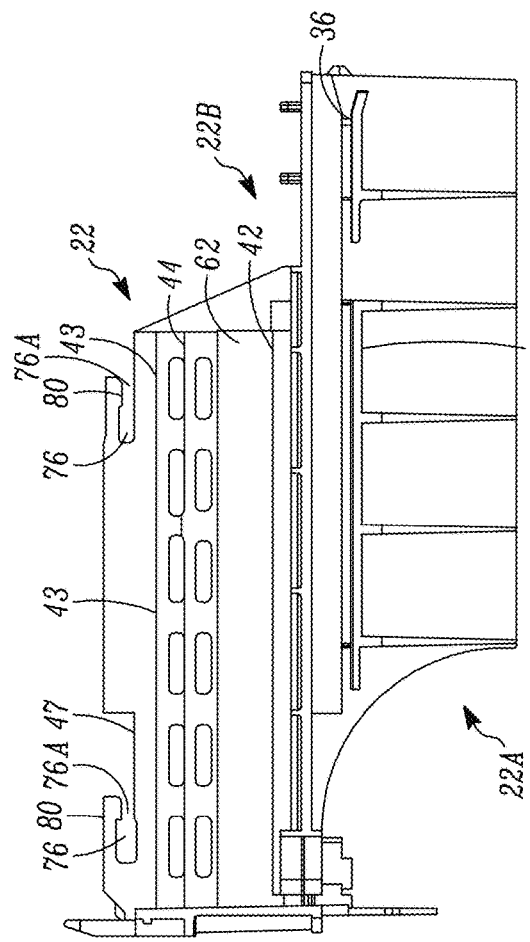
FIG. 5A is a sectional view of the base frame taken along line A-A of FIG. 4.
Figure 5B:
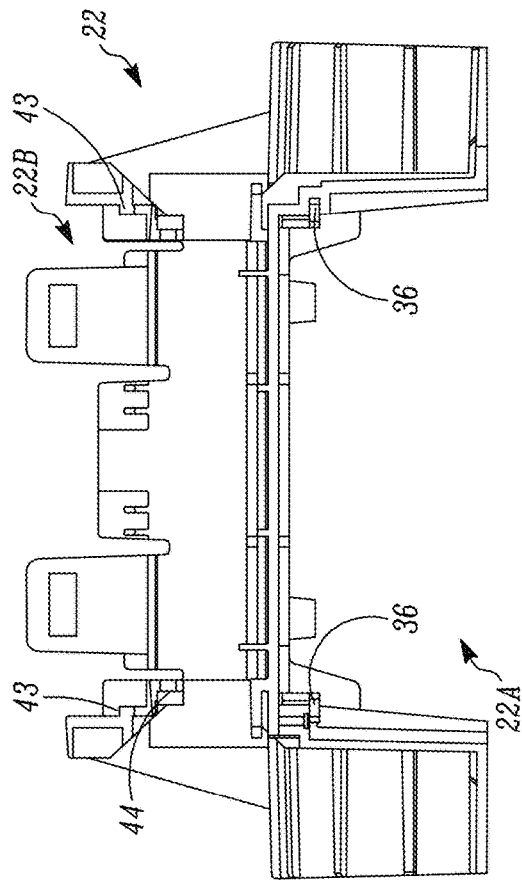
FIG. 5B is a sectional view of the base frame taken along line B-B of FIG. 4.
Figure 5:
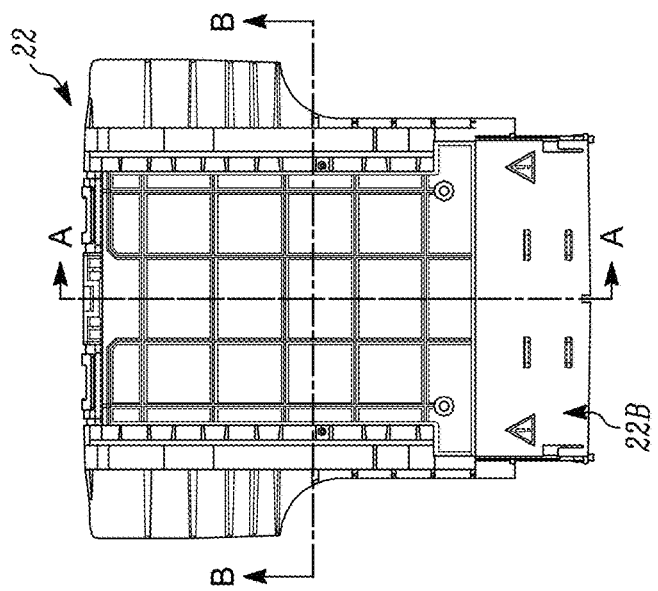
FIG. 5 is a top view of the base frame of FIG. 3.
Figure 7C:
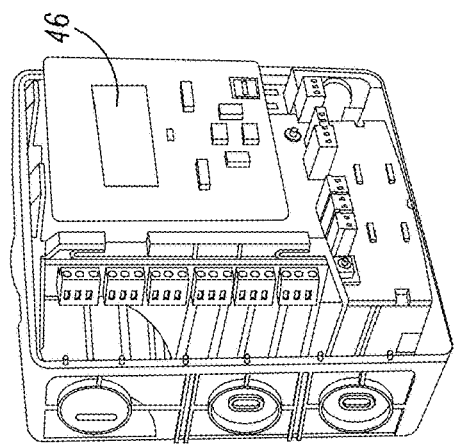
FIGS. 7A, 7B and 7C are perspective views showing installation of the base frame with components thereon in or to a back housing of the measurement device.
Figure 7B:
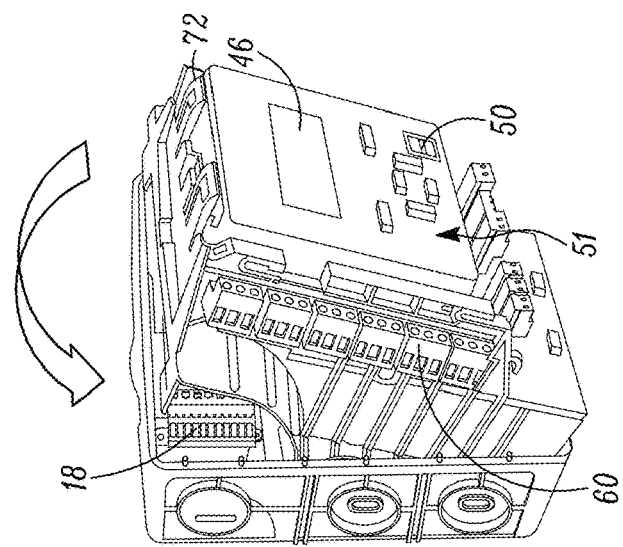
Figure 7A:
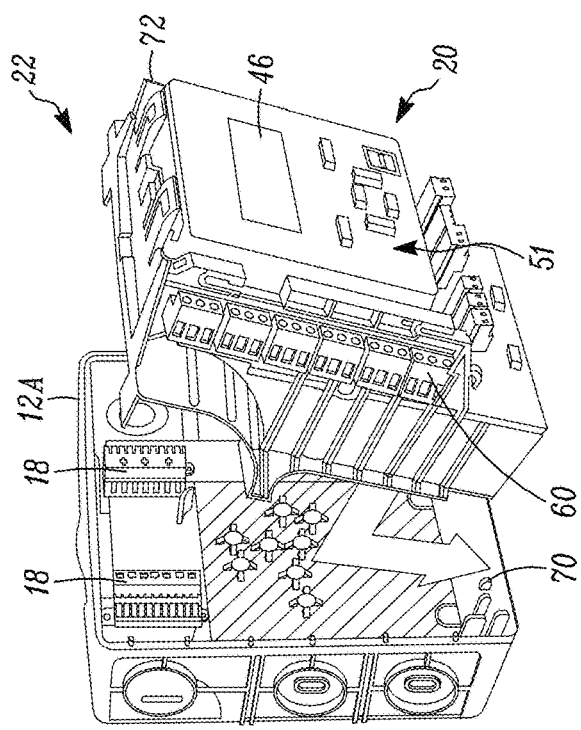

With respect to FIGS. 7A-7C, an installation of the base frame 22 with the electronic modules 24A-24C (not shown) and user interface assembly 20 is shown. The base frame 22, for example, may comprise tabs 56 that are received within slots 64 (FIG. 9) for holding the base frame 22 in position in the back housing 12A. As shown in FIG. 4, the base frame 22 includes frame tabs 68. These frame tabs 68 preferably include a rounded, arched or curved configuration so that when inserted into corresponding slots 70 (FIG. 7A) the base frame 22 is pivoted into the back housing 12A as shown.

The power module 24A (FIG. 2) preferably includes devices to enable an electrical communication via first connections 18. By way of example, first connections 18 may take the form of terminal blocks and the power module 24A may be equipped with voltage input leads. When installed the base frame 22 establishes an insulative barrier between the power source or voltage supplied into the first volume 28A and at least one of the second volume 28B within housing 12 and an exterior of the housing when the front housing 12B is separated or removed from the back housing 12A.

As further shown the measurement module 24B, for example, may include a plurality of second electrical connections 60, which may be referred to as current transformer connections or terminal blocks. To that end, elongated windows 62 are provided to receive the second electrical connections 60. As described above, the back housing 12A further includes the second openings 25 to receive current transformer leads, Ethernet cables or RS-485 wiring. As shown the second openings 25 may include plugs 27 that must be removed to complete wiring to the measurement device 10. Assuming all electrical connections are completed, the front housing 12B is detachable affixed to the slotted projections 72, shown for example in FIG. 4. The projections 72 are configured to bend or flex inward relative to the interior 28 to receive tabs (not shown) on the front housing 12B.

As one skilled in the art will appreciate, by reversing the steps of FIGS. 7A-7C the base frame, with the electronic modules 24A-24C and/or user interface assembly are removable from the housing 12 or back housing 12A as a single unit. This particular feature provides advantages not provided in prior art devices. More specifically, an operator or user can remove the entire modular unit including the base frame 22 and electronic modules 24A-24C. This disconnects the unit from being powered. An advantage of this is that the modular unit or measurement device 10 can then be interrogated off-line in a separate office or environment, reconfigured, etc. without the main power (external power source 17) being needed to be turned off.

The mounting of the user interface assembly 20 and its orientation and reorientation relative to the back housing 12A is described in more detail and in reference to FIGS. 3, 4, and 8A-8D. With respect to FIG. 3, the cover 20B of the user interface assembly 20 includes tabs 74 on each side thereof. In this embodiment the cover 20B has a rectangular configuration including a pair of tabs 74 on each of four sides, or eight tabs 74. The cover 20B and tabs 74 are sized and configures for sliding engagement of receiving slots 76.

More specifically, catches 80 are configured on the base frame 22 in spaced relation to or overhang ledges 47 forming receiving slots 76 for the mating engagement of the cover 20B or user interface assembly 20 to the base frame 22. Each catch 80 is spaced from a corresponding ledge 47 to form an opening 76A with a height or width dimension slightly smaller than a same dimension of a corresponding catch 80. In addition, each catch is configured or dimensioned relative to the base frame 22 and ledge 47 so that each catch 80 will flex to slightly open or close relative to the ledge 47 to secure or remove the user interface assembly 20 relative to the base frame.

Figure 8B:
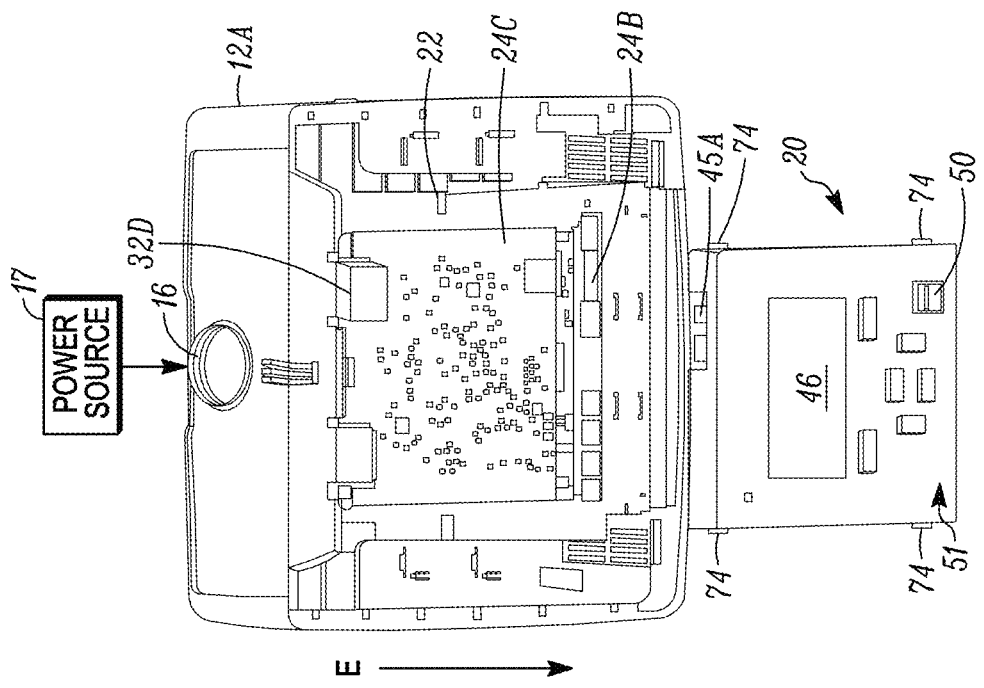
FIGS. 8A and 8B are perspective views an embodiment of the device with a back housing orientated in an upright position and a user interface assembly removed (FIG. 8B).
Figure 8A:
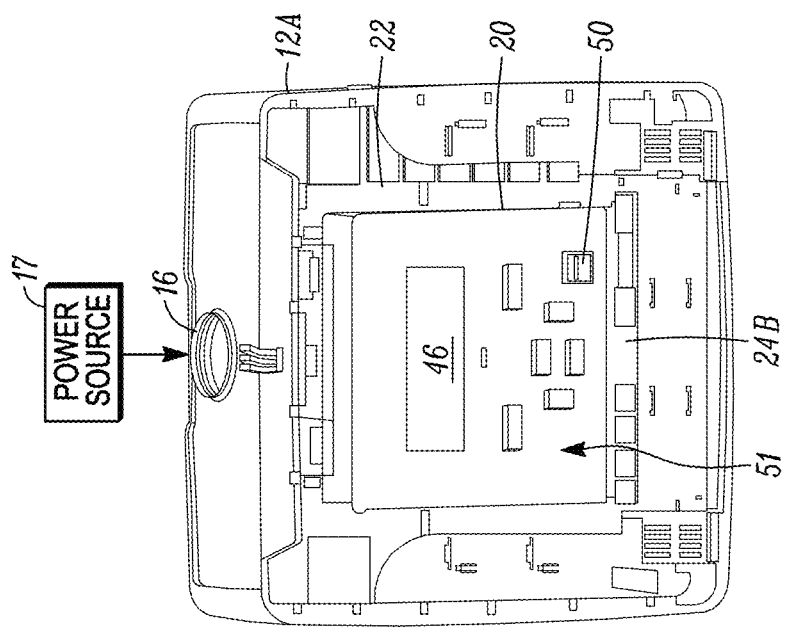
Figure 8D:
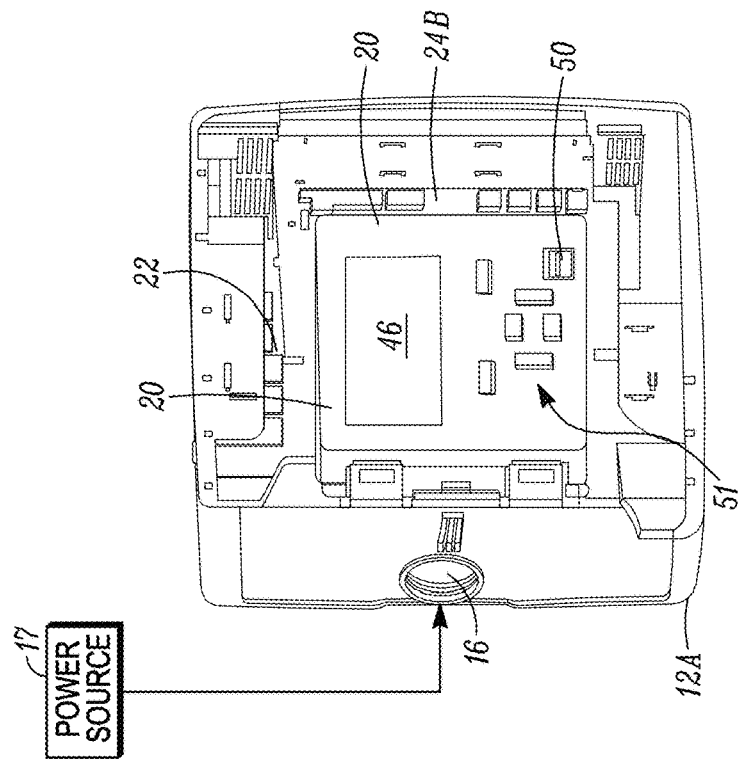
FIGS. 8C and 8D are perspective views of the device of FIGS. 8A and 8B with the back housing orientated in a side position with the user interface assembly remaining in an upright position for connection to the device.
Figure 8C:
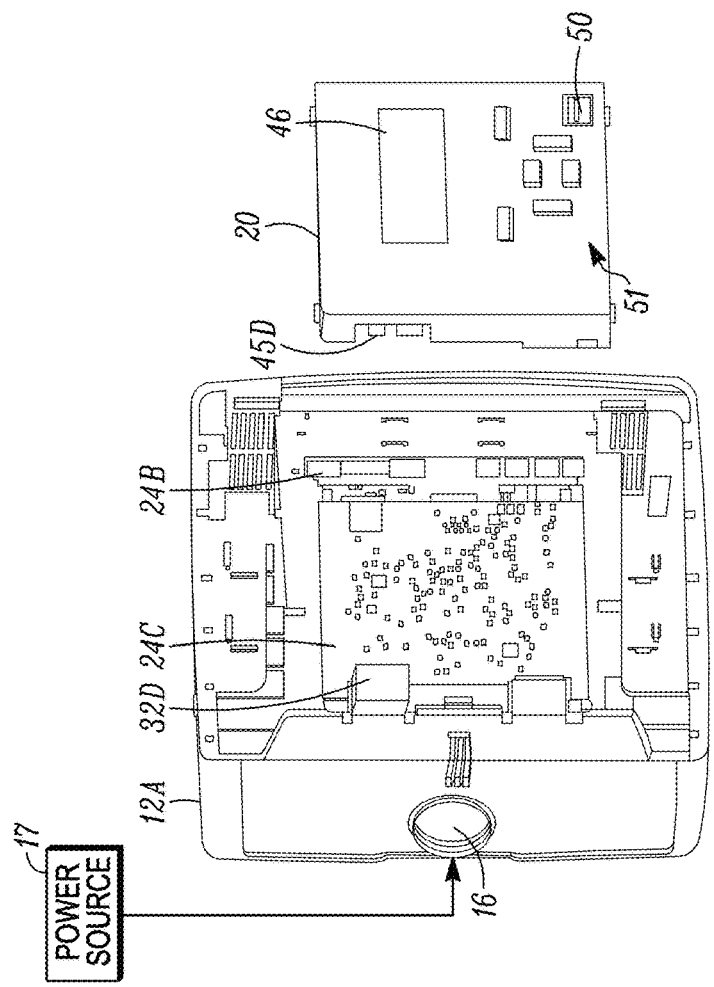

With respect to FIG. 8A, the measurement device 10 is shown with the back housing 12A in an upright position wherein, for example, the opening 16 is positioned for receipt of power lines from external power source 17. The removal of the user interface assembly 20 is shown with respect to FIG. 8B. More specifically, the user interface assembly 20 is slid laterally in the direction E indicated by the arrows, so the tabs 74 disengage from the slots 76 through corresponding openings 76A. In this manner, the user interface assembly is disengaged from the unit at the interconnection module 26 and connector 32D and lifted from the measurement device 10 as shown in FIG. 8C. As further shown, board connector 45A has been disengaged from connector 32D of interconnection module 26.

The back housing 12A in FIG. 8C is shown reoriented or rotated to a side or lateral position. As shown in FIG. 8C, the user interface assembly 20 does not require reorientation as it includes the multiple axially spaced connectors 45A-45D. Since the module is rectangular there are four connectors, one for each side or edge of the module 24C. In this example, connector 45D is aligned with connector 32D for mounting the user interface assembly 20 to the base frame 22 and/or measurement device 10. That is, the user interface assembly 20 is in the same upright position or orientation regardless of the orientation of the back housing 12A or measurement device 10 relative to for example an external power source 17, or a connection to the external power source 17. One skilled in the art will appreciate, that connector 45B would be used for connection with the back housing 12A oriented opposition the orientation of FIGS. 8C and 8D; and, connector 45C would be used for connection with the back housing 12A orientated opposite to that orientation of FIGS. 8A and 8B.

Figure 9:
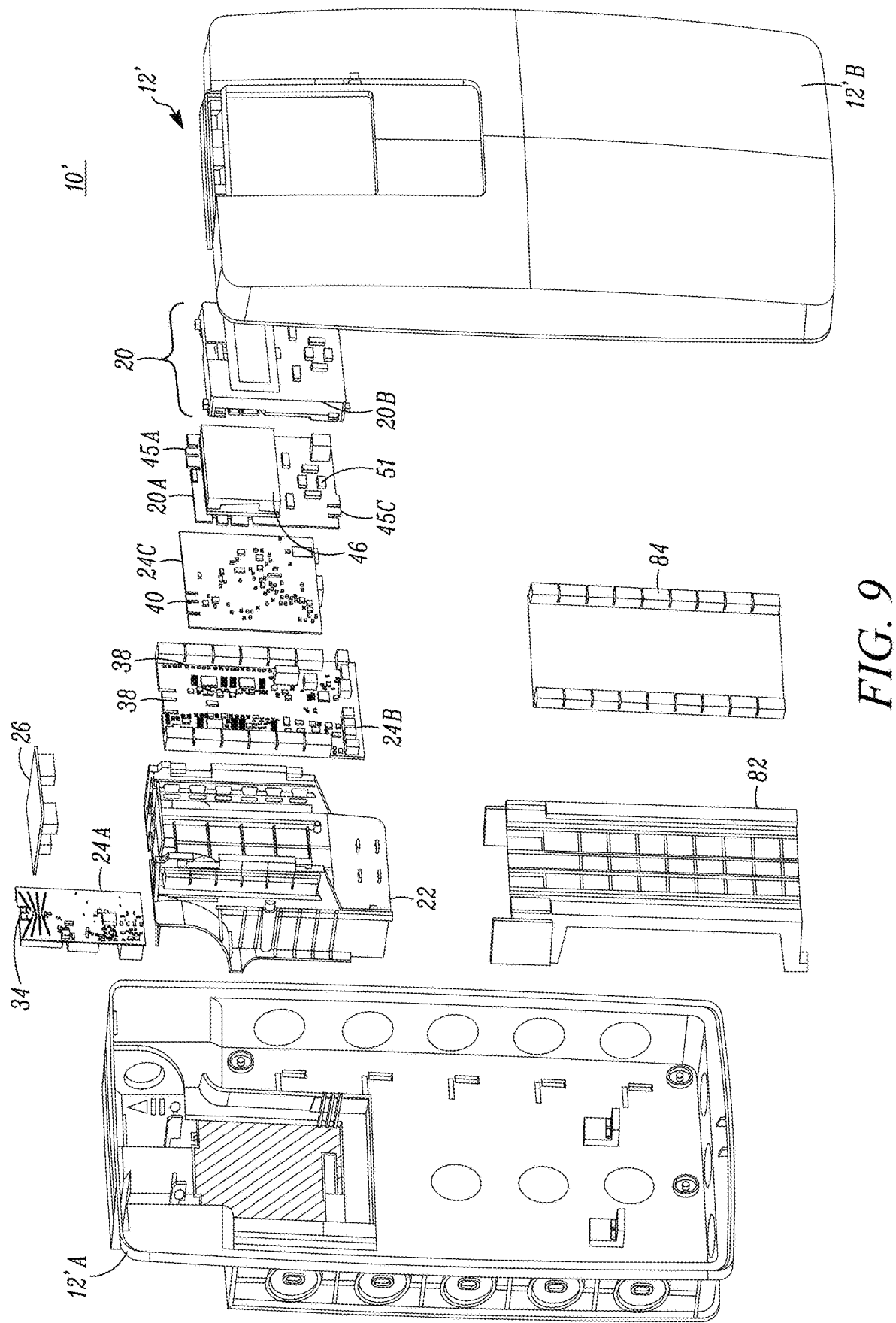
FIG. 9 is an exploded perspective view of a second embodiment of the measurement device.

Another embodiment of the invention for the measurement device 10' is illustrated in FIG. 9 and includes an extension 82 or configured to mount to the base frame 22. As shown, the measurement device 10' comprises the above described components including the modules 24A-24C, 26 and user interface assembly mounted to the base frame 22 as described above. In addition, a back housing 12A' and front housing 12B' are provided to receive the base frame 22, extension and electrical components.

In this manner, or more of the electronic modules 24, and by way of example, the measurement module 24B can be extended in at least two different ways. For example, the standard mainboard may be configured to accept a daughter board or module 84 and each daughterboard itself may be configured to accept another daughterboard. Alternatively, the standard module 24B may be uninstalled and removed from the base frame 22. In its place, an extended module configured to mate with the interconnection module 26 at connector 32B can be installed on the base frame 22.

Figure 10:
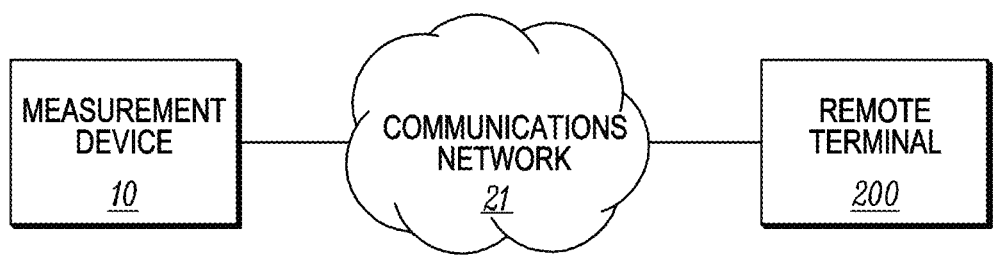
FIG. 10 is a block diagram that illustrates an example connection between a measurement device and remote terminal in accordance aspects of the invention.
Figure 11:
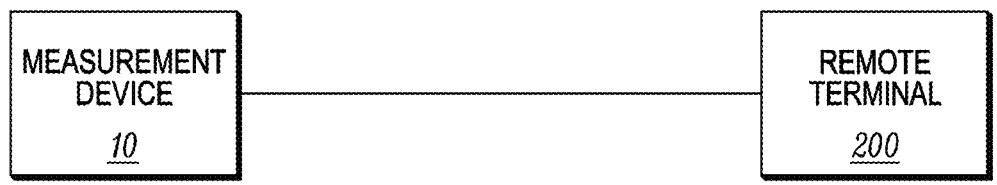
FIG. 11 is a block diagram that illustrates an example connection between a measurement device and remote terminal in accordance aspects of the invention.

Referring to FIGS. 10-11, are block diagram that illustrate an example connection between a measurement device 10 and a remote terminal 200, according to an embodiment. As a non-limiting example, the remote terminal 200 may be a personal computer, a server, a mobile device, such as a tablet or cell phone, the computer system 1900 described in reference to FIG. 19 below, the chipset 2000 described in reference to FIG. 20 below, or mobile terminal 2100 described in reference to FIG. 21 below.

In FIG. 10, the measurement device 10 and the remote terminal 200 are interconnected through the communications network 21. As may be appreciated by those skilled in the art, communications network 21 may include hardware and software components to facilitate the transmission of data and information. In FIG. 11, the measurement device 10 and the remote terminal 200 are directly connected to each other. As a non-limiting example, the measurement device 10 and the remote terminal 200 may be connected through a parallel port, a serial port, a universal serial bus (USB) port, and an Ethernet port.

Figure 12:
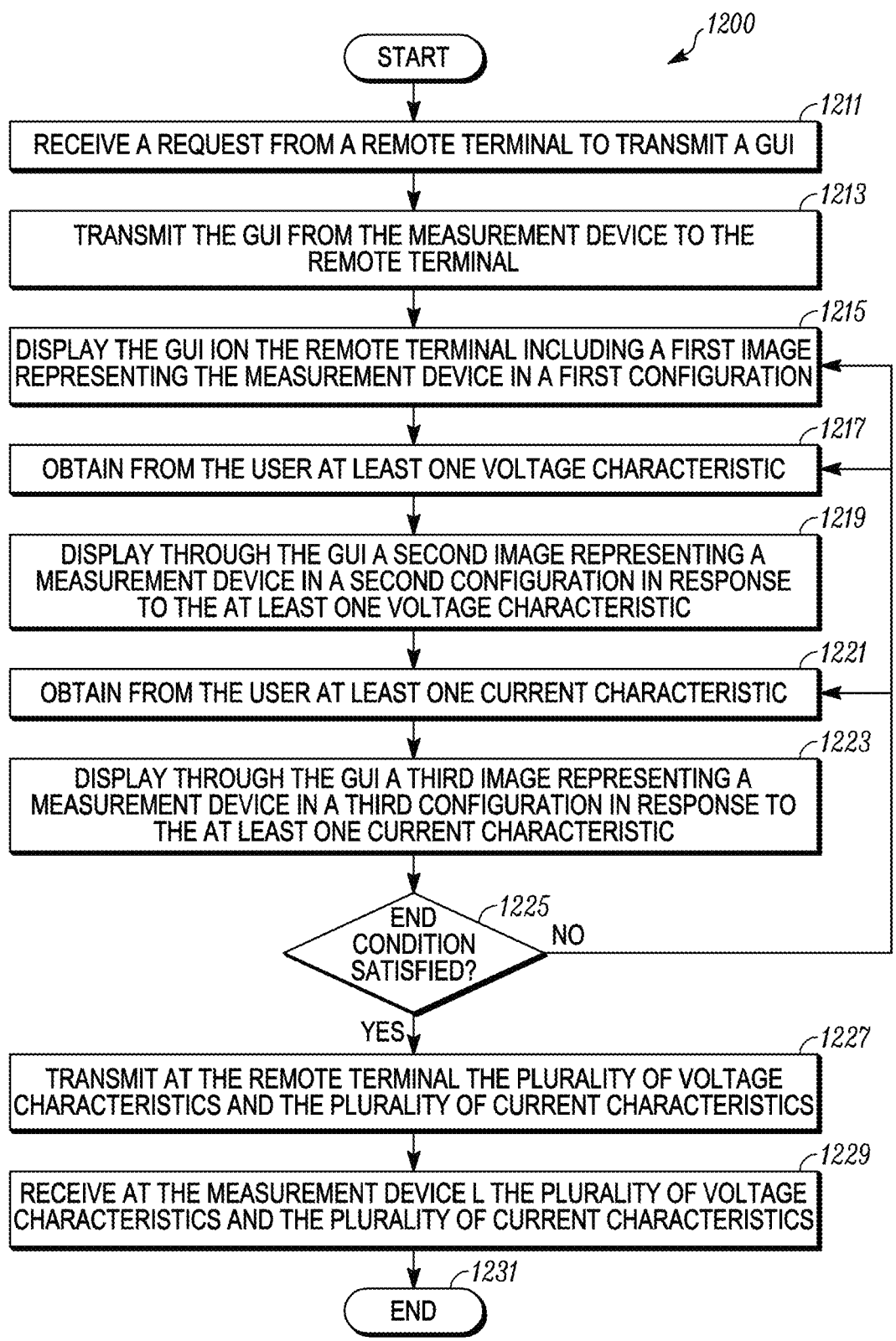
FIG. 12 is a flow chart that illustrates an example method of configuring a measurement device in accordance aspects of the invention.

Referring now to FIG. 12, a flow chart that illustrates an example method 1200 of configuring a measurement device 10 with a remote terminal 200, according to an embodiment, is shown. In step 1211, the remote terminal 200 sends a request to the measurement device 10 to transmit a graphical user interface back to the remote terminal 200. The request of step 1211 may be a web browser accessing a web server on the measurement device 10 and requesting a web page from the measurement device 10. In some non-limiting embodiments, the graphical user interface is a web browser loading a web page.

Figure 13:
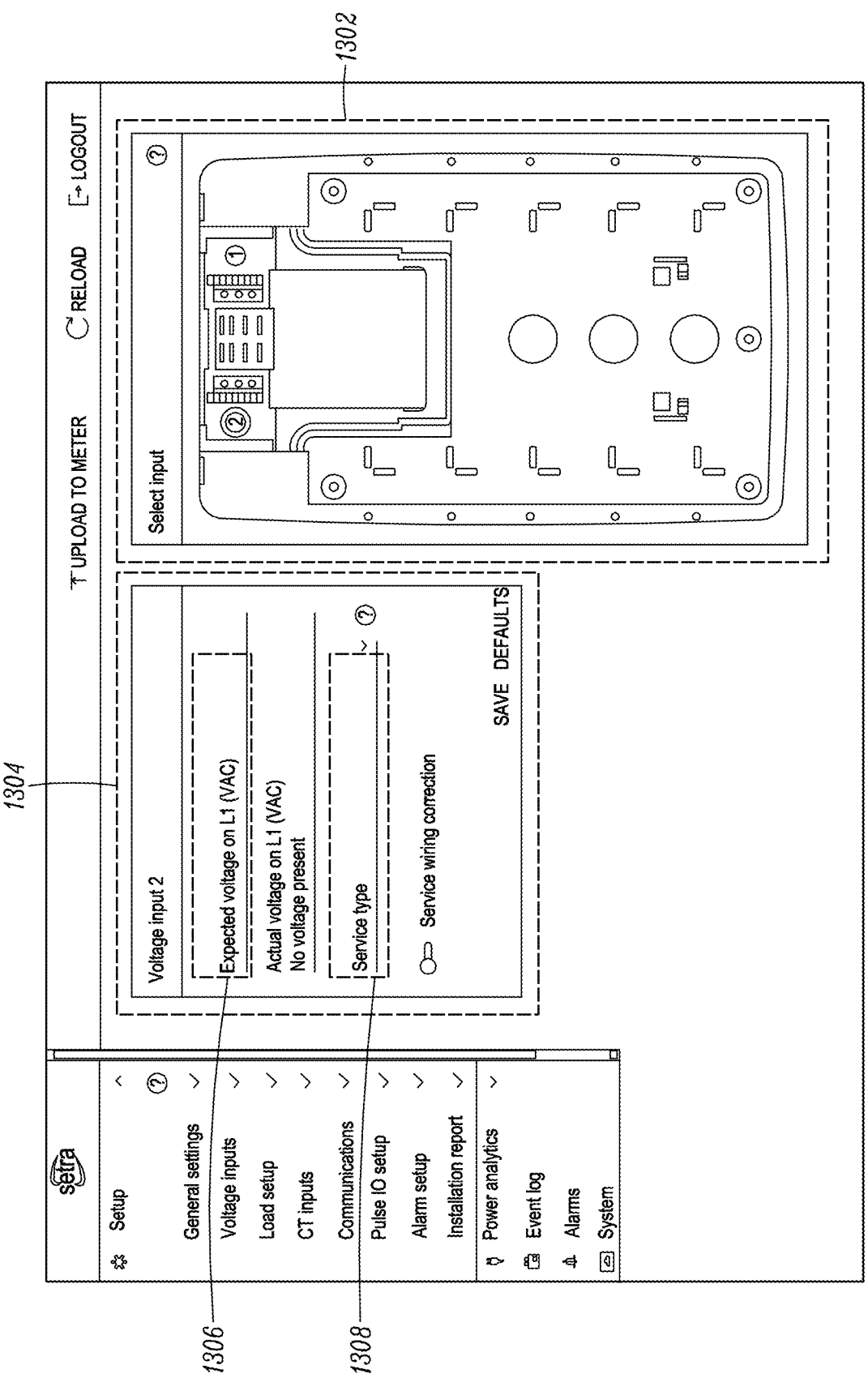
FIG. 13 is an exemplary screenshot of a GUI in accordance aspects of the invention.
Figure 15:
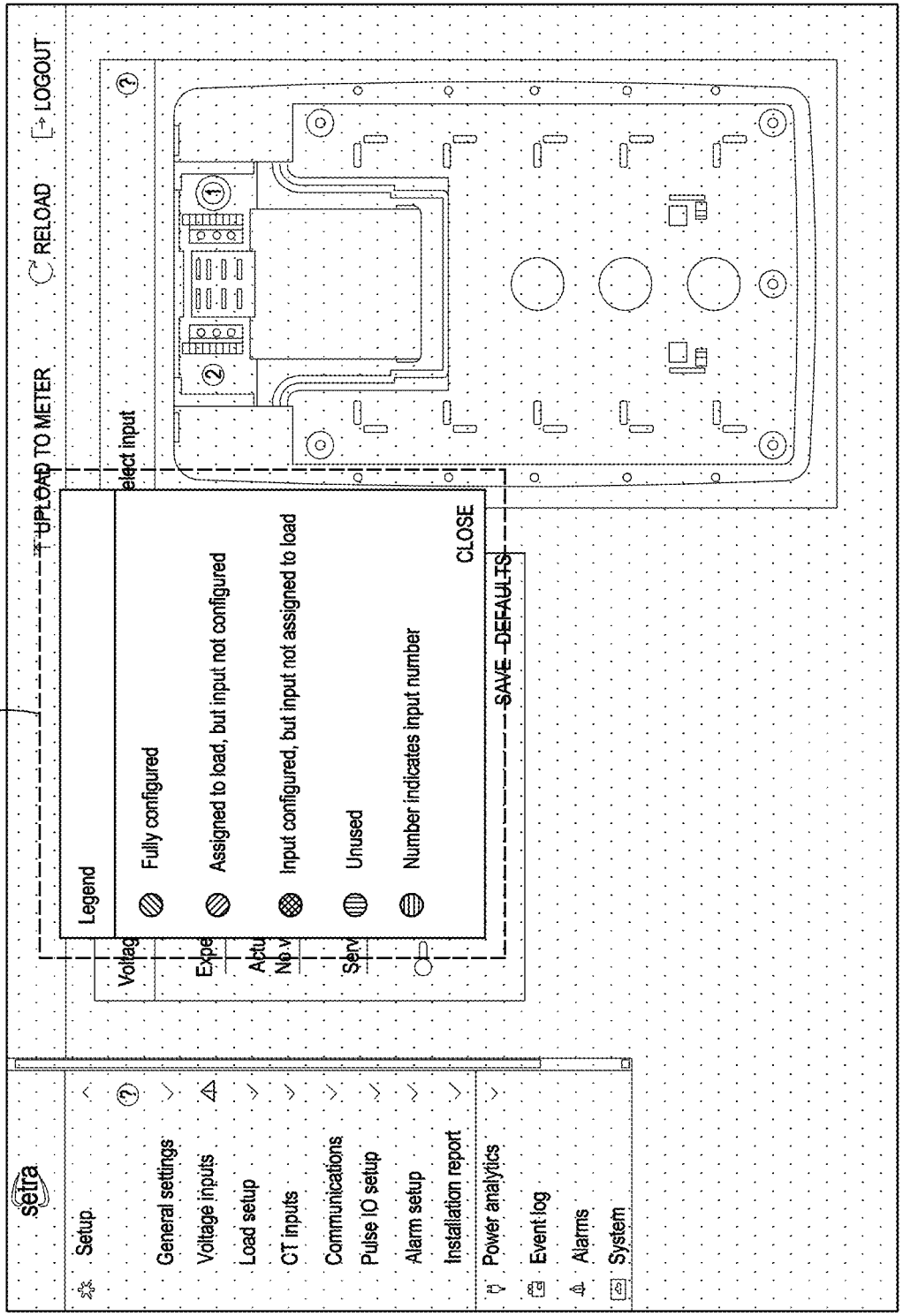
FIG. 15 is an exemplary screenshot of a GUI in accordance aspects of the invention.

In step 1213, the measurement device 10 transmits the GUI to the remote terminal 200. Then, in step 1215, the remote terminal 200 displays the GUI including a first image 1302 (discussed in further detail below) representative of the measurement device 10 in a first configuration. As a non-limiting example, the first image 1302 is illustrated in FIG. 13. In that example, the first image 1302 shows the inside of a non-limiting measuring device 10 and indicates two voltage inputs with numerals 1 and 2. Further, in that example, the measurement device 10 is shown in a neutral state indicating that no selection of either voltage input has been made and no values for the voltage characteristics 1304 have been entered corresponding to the first configuration. As an example, FIG. 15 shows a legend 1502 displayed by the GUI illustrating different variations of first configurations.

Figure 14:
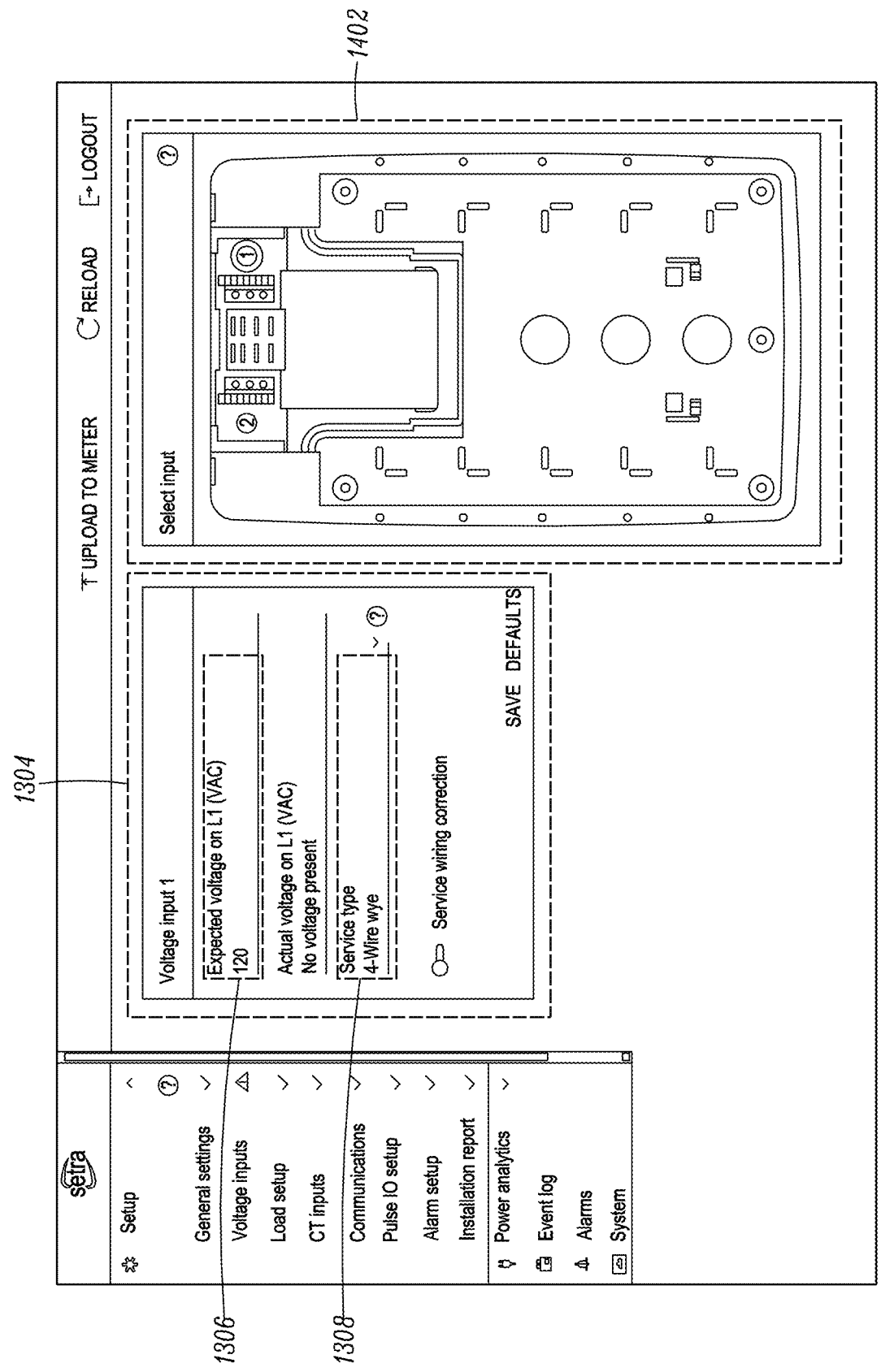
FIG. 14 is an exemplary screenshot of a GUI in accordance aspects of the invention.

In step 1217, the remote terminal 200 obtains from user at least one voltage characteristic 1304 of a plurality of voltage characteristics 1304 associated with at least one of a plurality of voltage inputs of the measurement device 10. Then, in step 1219, the remote terminal 200 displays the GUI including a second image 1402 (discussed in further detail below) representative of the measurement device 10 in a second configuration. As a non-limiting example, the second image 1402 is illustrated in FIG. 14. In that example, the second image 1402 shows the inside of a non-limiting measuring device 10 and indicates two voltage inputs with numerals 1 and 2, where numeral 1 has been highlighted with a halo surrounding it corresponding to a non-limiting second configuration. Further, in that example, the measurement device 10 is shown in a non-conforming state indicating that no selection of either voltage input has been made and no values for the voltage characteristics 1304 have been entered. However, in other non-limiting embodiments, the second image 1402 shows the measurement device 10 in an acceptable second configuration 1502. As an example, FIG. 15 shows a legend 1502 displayed by the GUI illustrating different variations of second configurations.

Figure 16:
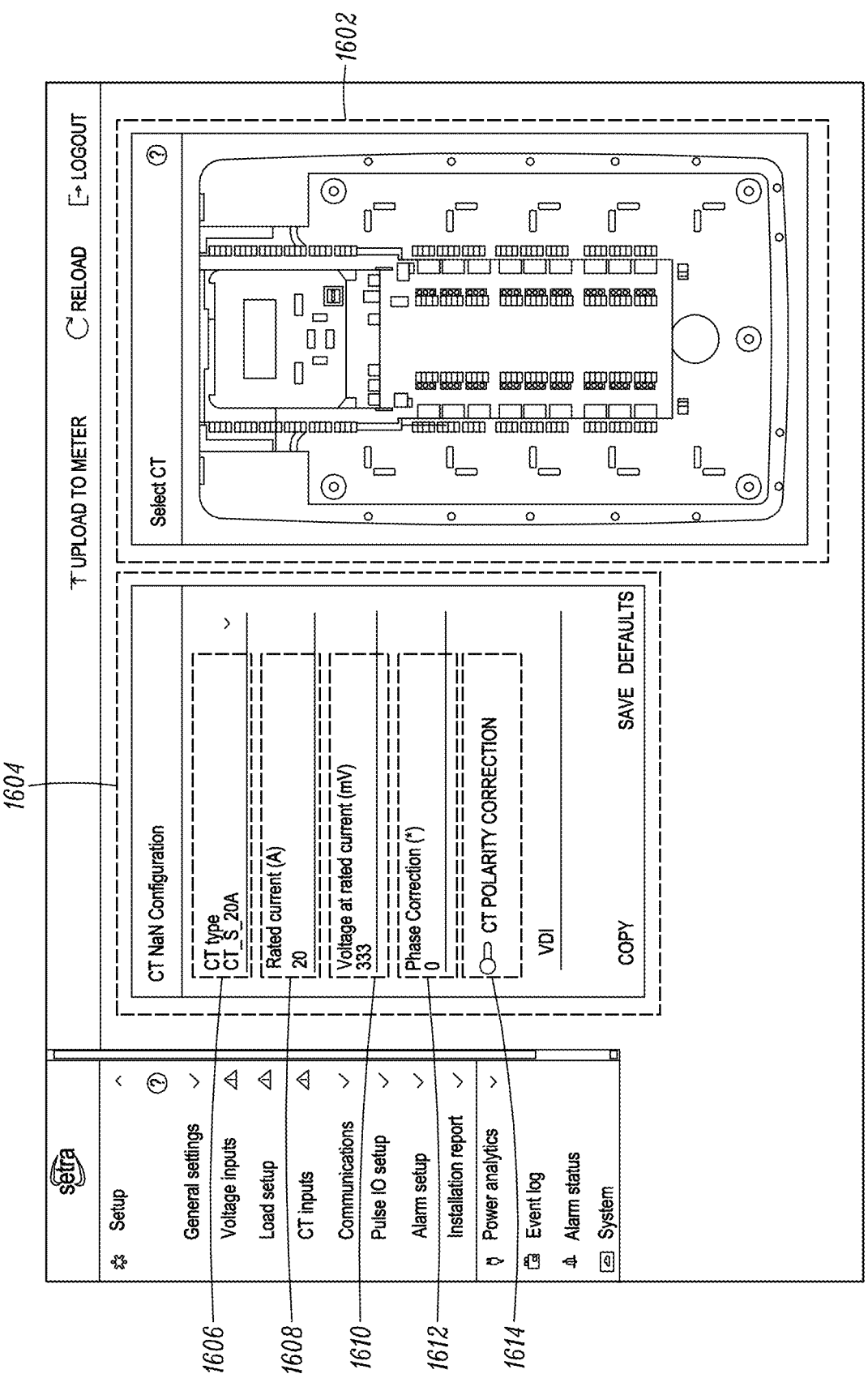
FIG. 16 is an exemplary screenshot of a GUI in accordance aspects of the invention.
Figure 17:
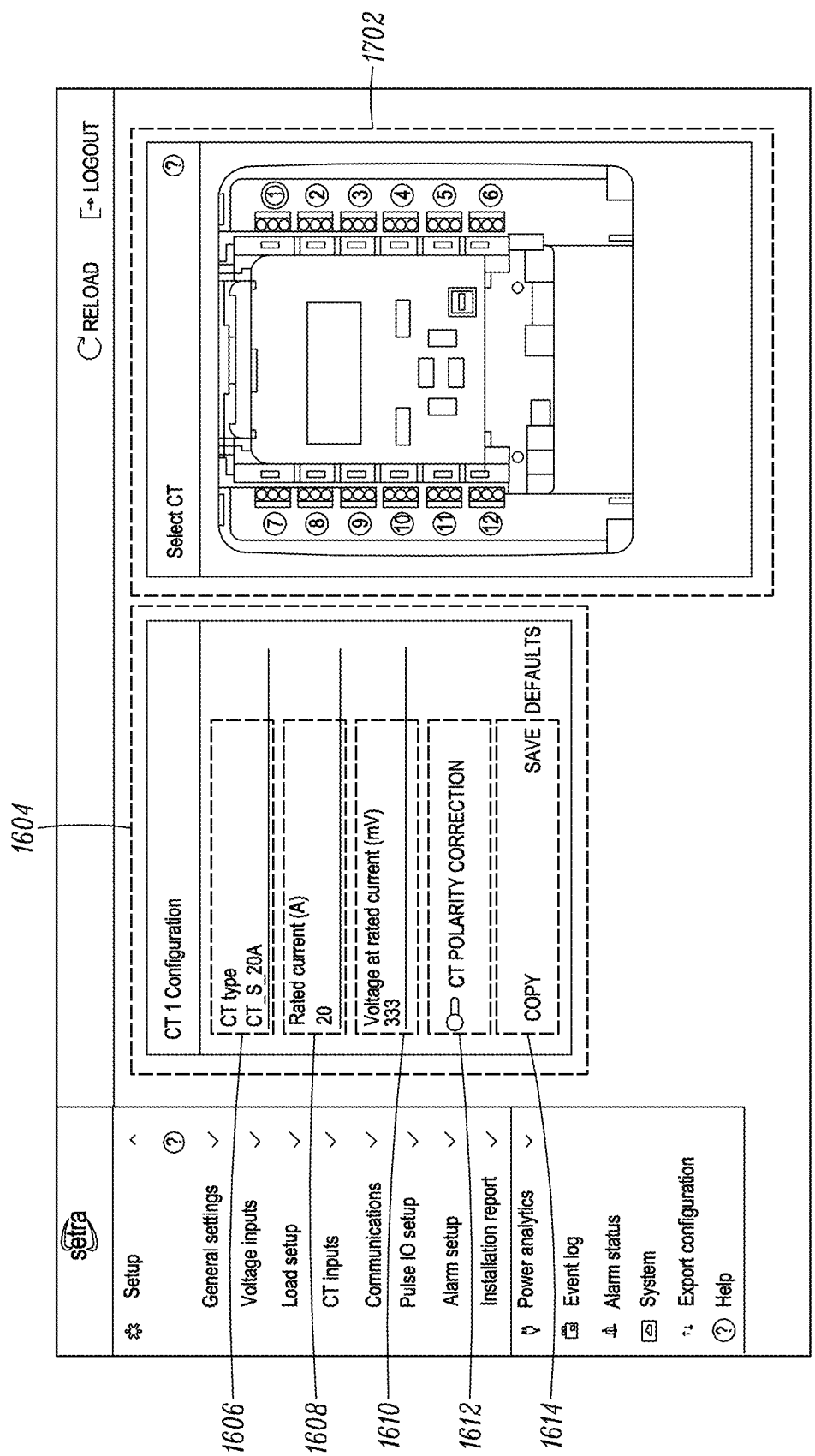
FIG. 17 is an exemplary screenshot of a GUI in accordance aspects of the invention.
Figure 18:
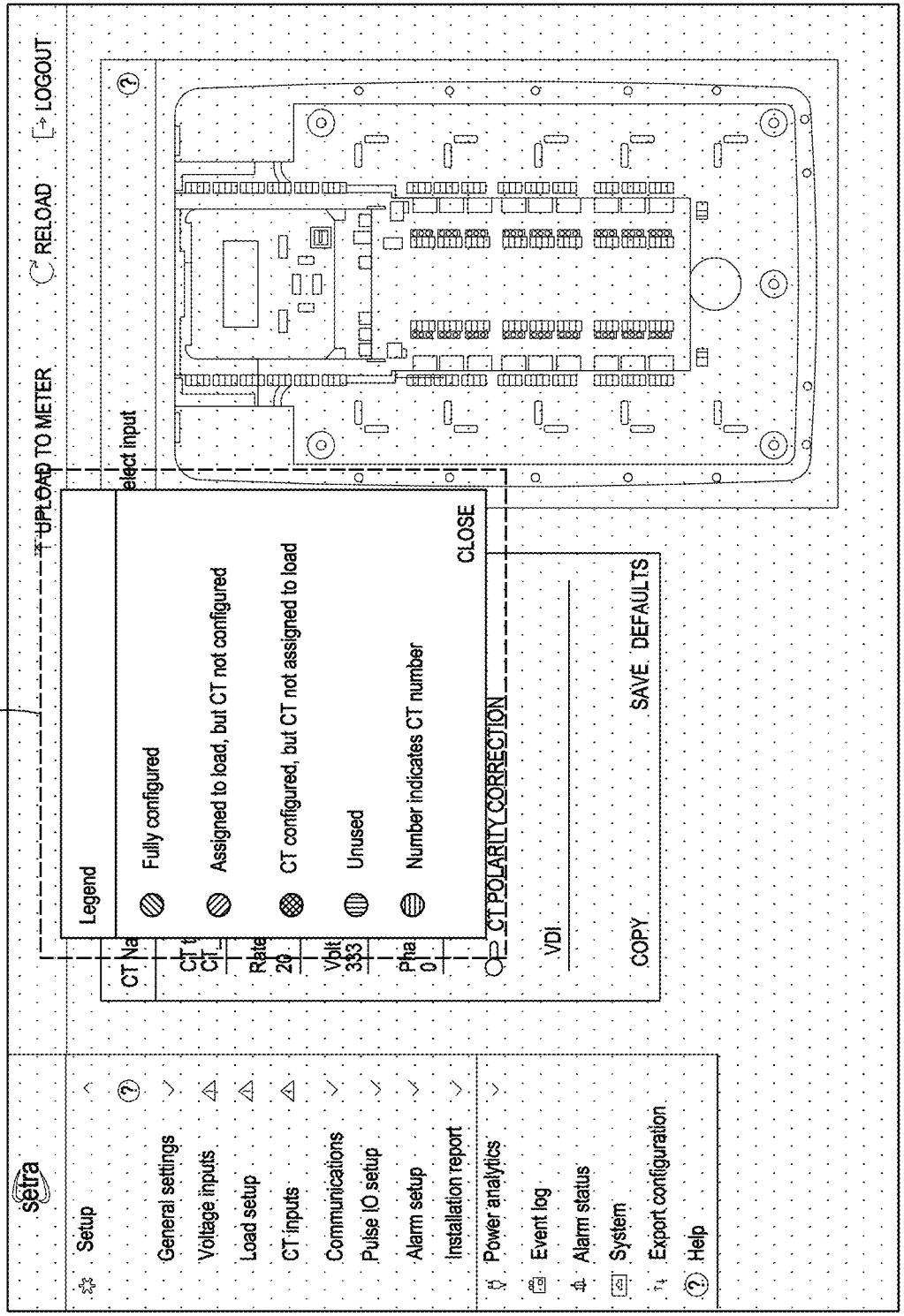
FIG. 18 is an exemplary screenshot of a GUI in accordance aspects of the invention.

In step 1221, the remote terminal 200 obtains from the user at least one current characteristic 1604 of a plurality of current characteristics 1604 associated with at least one of a plurality of current inputs of the measurement device 10. Then, in step 1223, the remote terminal 200 displays the GUI including a third image 1602 (discussed in further detail below) representative of the measurement device 10 in a third configuration 1602. As a non-limiting example, the third image 1602 is illustrated in FIG. 16. In that example, the third image 1602 shows the inside of a non-limiting measuring device 10 and indicates forty-eight current inputs. As may be noted by those skilled in the art, the amount of voltage inputs and current inputs is non-limiting. Further, in that example, the measurement device 10 is shown in a non-conforming state indicating that no selection of current input has been made and no values for the current characteristics 1604 have been entered. However, in other non-limiting embodiments, the third image 1602 shows the measurement device 10 in an acceptable third configuration 1702. As an example, FIG. 18 shows a legend 1802 displayed by the GUI illustrating different variations of third configurations.

In some embodiments, the remote terminal 200 may also obtain from the user between steps 1223 and 1225 at least on load characteristic of a plurality of load characteristics associated with a combination of at least one of the plurality of input voltages and at least one of the plurality of input currents. The remote terminal 200 may also display the GUI including a fourth image (similar to the second and third images) of the measurement device 10 in a fourth configuration 1602 in at least one of a neutral state, an acceptable state and a non-conforming state as otherwise described herein. Then, in step 1225, if an end condition such as all voltage characteristics 1304 for all voltage inputs and all current characteristics 1604 for all current inputs are satisfied the method 1200 moves onto step 1227. In step 1227, the remote terminal 200 transmits to the measurement device 10 all voltage characteristics 1304 for all voltage inputs and all current characteristics 1604 for all current inputs. In other embodiments, the remote terminal 200 may also transmit all load characteristics. In step 1229, the measurement may receive all voltage characteristics 1304 for all voltage inputs, all current characteristics 1604 for all current inputs and all load characteristics, and, in step 1229, the measurement device 10 stores the plurality of voltage characteristics 1304, the plurality of current characteristics 1604, and the plurality of load characteristics on a memory of the measurement device 10. In some embodiments, at least one of the measurement device 10 and the remote terminal 200 may produce a user readable documents including the plurality of the plurality of voltage characteristics 1304, the plurality of current characteristics 1604, and the plurality of load characteristics. As used herein, a user readable document, is any document containing text and/or images representing information understandable by a human person. As a non-limiting example, a user readable document may be a Word or Excel document. As it may be appreciated by those skilled in the art, the plurality of voltage characteristics 1304, the plurality of current characteristics 1604, and the plurality of load characteristics stored on a memory may be categorized in multiple ways and organized for the inspection of the user. As an example, the plurality of voltage characteristics 1304, the plurality of current characteristics 1604, and the plurality of load characteristics stored on a memory may be assigned identifiers associated with specific dates and users.

However, if the end condition is not met in step 1225, the method 1200 return to at least one of step 1215, 1217, and 1221 depending on which characteristic is required.

Figure 19:
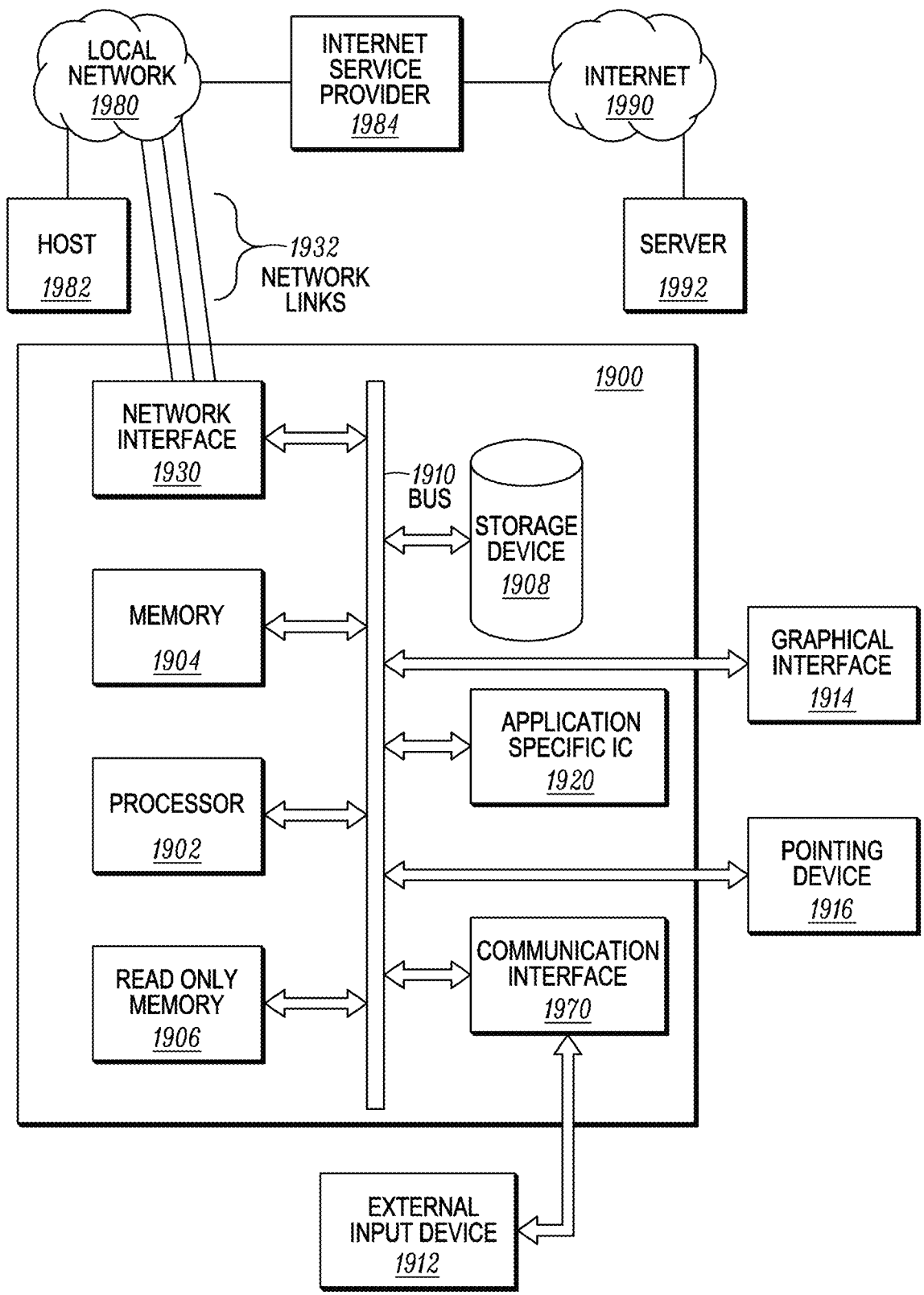
FIG. 19 is a block diagram that illustrates a computing device upon which an embodiment of the invention may be implemented.

FIG. 19 is a block diagram that illustrates a computer system 1900 upon which an embodiment of the invention may be implemented. In some embodiments, at least one of the measurement device 10, the remote terminal 200, and portions thereof may be a computer system 1900. Computer system 1900 includes a communication mechanism such as a bus 1910 for passing information between other internal and external components of the computer system 1900. Information is represented as physical signals of a measurable phenomenon, typically electric voltages, but including, in other embodiments, such phenomena as magnetic, electromagnetic, pressure, chemical, molecular atomic and quantum interactions. For example, north and south magnetic fields, or a zero and non-zero electric voltage, represent two states (0, 1) of a binary digit (bit). Other phenomena can represent digits of a higher base. A sequence of one or more digits constitutes digital data that is used to represent a number or code for a character. In some embodiments, information called analog data is represented by a near continuum of measurable values within a particular range. Computer system 1900, or a portion thereof, constitutes a means for performing one or more steps of one or more methods described herein.

A sequence of binary digits constitutes digital data that is used to represent a number or code for a character. A bus 1910 includes many parallel conductors of information so that information is transferred quickly among devices coupled to the bus 1910. One or more processors 1902 for processing information are coupled with the bus 1910. A processor 1902 performs a set of operations on information. The set of operations include bringing information in from the bus 1910 and placing information on the bus 1910. The set of operations also typically include comparing two or more units of information, shifting positions of units of information, and combining two or more units of information, such as by addition or multiplication. A sequence of operations to be executed by the processor 1902 constitutes computer instructions.

Computer system 1900 also includes a memory 1904 coupled to bus 1910. The memory 1904, such as a random-access memory (RAM) or other dynamic storage device, stores information including computer instructions. Dynamic memory allows information stored therein to be changed by the computer system 1900. RAM allows a unit of information stored at a location called a memory address to be stored and retrieved independently of information at neighboring addresses. The memory 1904 is also used by the processor 1902 to store temporary values during execution of computer instructions. The computer system 1900 also includes a read only memory (ROM) 1906 or other static storage device coupled to the bus 1910 for storing static information, including instructions, that is not changed by the computer system 1900. Also coupled to bus 1910 is a non-volatile (persistent) storage device 1908, such as a magnetic disk, optical disk, solid-state storage or FLASH-EPROM, for storing information, including instructions, that persists even when the computer system 1900 is turned off or otherwise loses power.

Information, including instructions, is provided to the bus 1910 for use by the processor from an external input device 1912, such as a keyboard containing alphanumeric keys operated by a human user, or a sensor. A sensor detects conditions in its vicinity and transforms those detections into signals compatible with the signals used to represent information in computer system 1900. Other external devices coupled to bus 1910, used primarily for interacting with humans, include a graphical interface 1914, such as a cathode ray tube (CRT) or a liquid crystal display (LCD), for presenting images or a graphical user interface, and a pointing device 1916, such as a mouse or a trackball or cursor direction keys, for controlling a position of a small cursor image presented on the display 1914 and issuing commands associated with graphical elements presented on the display 1914.

In the illustrated embodiment, special purpose hardware, such as an application specific integrated circuit (IC) 1920, is coupled to bus 1910. The special purpose hardware is configured to perform operations not performed by processor 1902 quickly enough for special purposes. Examples of application specific ICs include graphics accelerator cards for generating images for display 1914, cryptographic boards for encrypting and decrypting messages sent over a network, speech recognition, field programmable gated arrays (FPGA), programable logic controllers, and interfaces to special external devices, such as robotic arms and medical scanning equipment that repeatedly perform some complex sequence of operations that are more efficiently implemented in hardware.

In other embodiments, the computer system 1900 includes a network interface 1930 as special purpose hardware for transmitting and receiving information flow over a network. In general, each coupling is with a network link 1932 that is connected to another device in or attached to a network, such as local network 1980 in the illustrated embodiment, to which a variety of external devices with their own processors are connected. In some embodiments an input interface or an output interface or both are linked to each of one or more external network elements. Although three network links 1932a, 1932b, 1932c are included in network links 1932 in the illustrated embodiment, in other embodiments, more or fewer links are connected to network interface 1930. Network links 1932 typically provides information communication through one or more networks to other devices that use or process the information. For example, network link 1932b may provide a connection through network 1980 to a host computer 1982 or to equipment operated by an Internet Service Provider (ISP) 1984. ISP equipment 1984 in turn provides data communication services through the public, world-wide packet-switching communication network of networks now commonly referred to as the Internet 1990. A computer called a server 1992 connected to the Internet provides a service in response to information received over the Internet. For example, server 1992 provides routing information for use with network interface 1930. In some embodiments, at least one of the measurement device 10, the remote terminal 200, and portions thereof may be at least one of a server 1992 and a host 1982.

The network interface 1930 includes logic and circuitry configured to perform switching functions associated with passing information among elements of network 1980, including passing information received along one network link, e.g. 1932a, as output on the same or different network link, e.g., 1932c. The network interface 1930 switches information traffic arriving on an input interface to an output interface according to pre-determined protocols and conventions that are well known. In some embodiments, network interface 1930 includes its own processor and memory to perform some of the switching functions in software. In some embodiments, network interface 1930 relies on processor 1902, memory 1904, ROM 1906, storage device 1908, or some combination, to perform one or more switching functions in software. For example, network interface 1930, in cooperation with processor 1902 implementing a particular protocol, can determine a destination of a packet of data arriving on input interface on link 1932a and send it to the correct destination using output interface on link 1932c. The destinations may include host 1982, server 1992, other terminal devices connected to network 1980 or Internet 1990, or other routing and switching devices in network 1980 or Internet 1990.

Computer system 1900 also includes one or more instances of a communications interface 1970 coupled to bus 1910. Communication interface 1970 provides a two-way communication coupling to a variety of external devices that operate with their own processors, such as printers, scanners, and external disks. In some embodiments, at least one of the measurement device 10, the remote terminal 200, and portions thereof may be an external device. In other embodiments, the communication interface 1970 and the network interface 1930 may be the same system, may share similar components, or complement each other in the performance of their respective functions.

As a non-limiting example, at least one of the communication interface 1970 and the network interface 1930 may be a parallel port or a serial port or a universal serial bus (USB) port. In some embodiments, at least one of the communication interface 1970 and the network interface 1930 is an integrated services digital network (ISDN) card or a digital subscriber line (DSL) card or a telephone modem that provides an information communication connection to a corresponding type of telephone line. In some embodiments, at least one of the communication interface 1970 and the network interface 1930 is a cable modem that converts signals on bus 1910 into signals for a communication connection over a coaxial cable or into optical signals for a communication connection over a fiber optic cable. As another example, at least one of the communication interface 1970 and the network interface 1930 may be a local area network (LAN) card to provide a data communication connection to a compatible LAN, such as Ethernet. As another example, at least one of the communication interface 1970 and the network interface 1930 may be a modulator-demodulator (modem) to provide a wireless link to other devices capable of receiving information wirelessly. Carrier waves, such as acoustic waves and electromagnetic waves, including radio, optical and infrared waves travel through space without wires or cables. Signals include man-made variations in amplitude, frequency, phase, polarization or other physical properties of carrier waves. For wireless links, at least one of the communication interface 1970 and the network interface 1930 may send and receive electrical, acoustic or electromagnetic signals, including infrared and optical signals, that carry information streams, such as digital data.

The term computer-readable medium is used herein to refer to any medium that participates in providing information to processor 1902, including instructions for execution. Such a medium may take many forms, including, but not limited to, non-volatile media, volatile media and transmission media. Non-volatile media include, for example, optical or magnetic disks, such as storage device 1908. Volatile media include, for example, dynamic memory 1904. Transmission media include, for example, coaxial cables, copper wire, fiber optic cables, and waves that travel through space without wires or cables, such as acoustic waves and electromagnetic waves, including radio, optical and infrared waves. The term computer-readable storage medium is used herein to refer to any medium that participates in providing information to processor 1902, except for transmission media.

Common forms of computer-readable media include, for example, a floppy disk, a flexible disk, a hard disk, a magnetic tape, or any other magnetic medium, a compact disk ROM (CD-ROM), a digital video disk (DVD) or any other optical medium, punch cards, paper tape, or any other physical medium with patterns of holes, a RAM, a programmable ROM (PROM), an erasable PROM (EPROM), a FLASH-EPROM, or any other memory chip or cartridge, a carrier wave, or any other medium from which a computer can read. The term non-transitory computer-readable storage medium is used herein to refer to any medium that participates in providing information to processor 1902, except for carrier waves and other signals.

Logic encoded in one or more tangible media includes one or both of processor instructions on a computer-readable storage media and special purpose hardware, such as ASIC 1920.

The invention is related to the use of computer system 1900 for implementing the techniques described herein. According to one embodiment of the invention, those techniques are performed by computer system 1900 in response to processor 1902 executing one or more sequences of one or more instructions contained in memory 1904. Such instructions, also called software and program code, may be read into memory 1904 from another computer-readable medium such as storage device 1908. Execution of the sequences of instructions contained in memory 1904 causes processor 1902 to perform the method steps described herein. In alternative embodiments, hardware, such as application specific integrated circuit 1920, may be used in place of or in combination with software to implement the invention. Thus, embodiments of the invention are not limited to any specific combination of hardware and software.

The signals transmitted over network link 1932 and other networks through communications interface 1970 or network interface 1930, carry information to and from computer system 1900. Computer system 1900 can send and receive information, including program code, through the network 1980, 1990 among others, through at least one of network link 1932, communications interface 1970, and network interface 1930. In a non-limiting example using the Internet 1990, a server 1992 transmits program code for a particular application, requested by a message sent from computer system 1900, through Internet 1990, ISP equipment 1984, network 1980, network interface 1930, and communications interface 1970. The received code may be executed by processor 1902 as it is received or may be stored in storage device 1908 or other non-volatile storage for later execution, or both. In this manner, computer system 1900 may obtain application program code in the form of a signal on a carrier wave.

Various forms of computer readable media may be involved in carrying one or more sequence of instructions or data or both to processor 1902 for execution. For example, instructions and data may initially be carried on a magnetic disk of a remote computer such as host 1982. The remote computer loads the instructions and data into its dynamic memory and sends the instructions and data over a telephone line using a modem. A modem local to the computer system 1900 receives the instructions and data on a telephone line and uses an infra-red transmitter to convert the instructions and data to a signal on an infra-red a carrier wave serving as the network link 1932. An infrared detector serving as communications interface 1970 receives the instructions and data carried in the infrared signal and places information representing the instructions and data onto bus 1910. Bus 1910 carries the information to memory 1904 from which processor 1902 retrieves and executes the instructions using some of the data sent with the instructions. The instructions and data received in memory 1904 may optionally be stored on storage device 1908, either before or after execution by the processor 1902.

Figure 20:
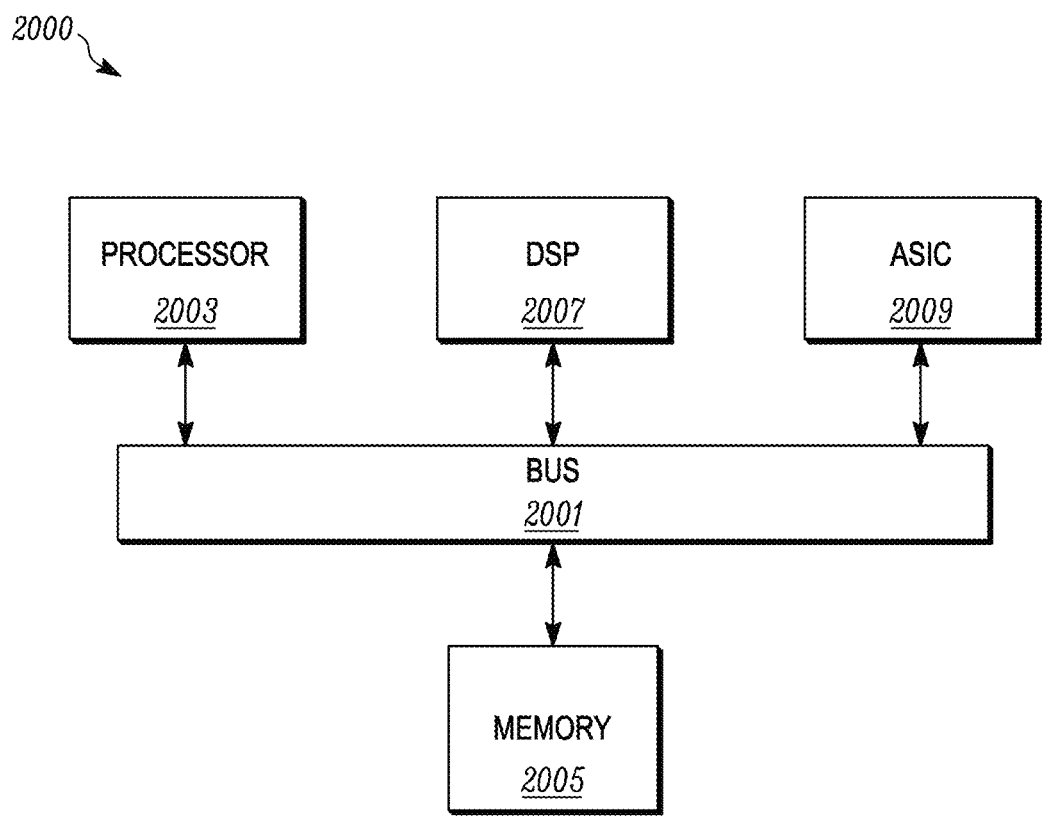
FIG. 20 is a block diagram that illustrates a chip set upon which an embodiment of the invention may be implemented.

FIG. 20 illustrates a chip set 2000 upon which an embodiment of the invention may be implemented. Chip set 2000 is programmed to perform one or more steps of a method described herein and includes, for instance, the processor and memory components described with respect to FIG. 19 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip. Chip set 2000, or a portion thereof, constitutes a means for performing one or more steps of a method described herein.

In one embodiment, the chip set 2000 includes a communication mechanism such as a bus 2001 for passing information among the components of the chip set 2000. A processor 2003 has connectivity to the bus 2001 to execute instructions and process information stored in, for example, a memory 2005. The processor 2003 may include one or more processing cores with each core configured to perform independently. A multi-core processor enables multiprocessing within a single physical package. Examples of a multi-core processor include two, four, eight, or greater numbers of processing cores. Alternatively, or in addition, the processor 2003 may include one or more microprocessors configured in tandem via the bus 2001 to enable independent execution of instructions, pipelining, and multithreading. The processor 2003 may also be accompanied with one or more specialized components to perform certain processing functions and tasks such as one or more digital signal processors (DSP) 2007, or one or more application-specific integrated circuits (ASIC) 2009. A DSP 2007 typically is configured to process real-world signals (e.g., sound) in real time independently of the processor 2003. Similarly, an ASIC 2009 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 2003 and accompanying components have connectivity to the memory 2005 via the bus 2001. The memory 2005 includes both dynamic memory (e.g., RAM, magnetic disk, writable optical disk, etc.) and static memory (e.g., ROM, CD-ROM, etc.) for storing executable instructions that when executed perform one or more steps of a method described herein. The memory 2005 also stores the data associated with or generated by the execution of one or more steps of the methods described herein.

Figure 21:
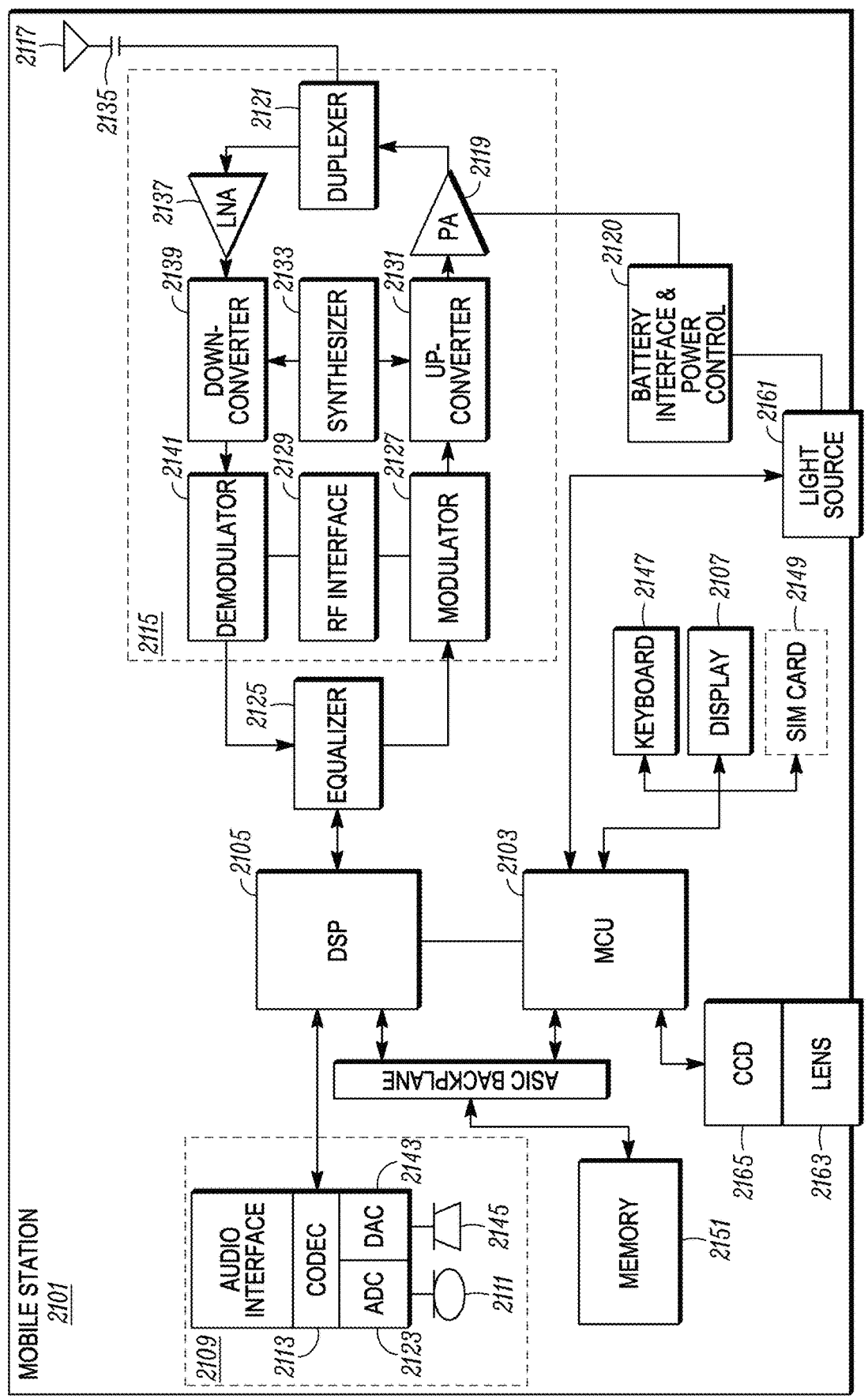
FIG. 21 is a diagram of exemplary components of a mobile terminal upon which an embodiment of the invention may be implemented.

FIG. 21 is a diagram of exemplary components of a mobile terminal 2100 for communications, upon which an embodiment of the invention may be implemented. In some embodiments, at least one of the measurement device 10, the remote terminal 200, and portions thereof may be a mobile terminal 2100. In some other embodiments, mobile terminal 2100, or a portion thereof, constitutes a means for performing one or more steps described herein. Generally, a radio receiver is often defined in terms of front-end and back-end characteristics. The front-end of the receiver encompasses all of the Radio Frequency (RF) circuitry whereas the back end encompasses all of the base-band processing circuitry. As used in this application, the term "circuitry" refers to both: (1) hardware-only implementations (such as implementations in only analog and/or digital circuitry), and (2) to combinations of circuitry and software (and/or firmware) (such as, if applicable to the particular context, to a combination of processor(s), including digital signal processor(s), software, and memory(ies) that work together to cause an apparatus, such as a mobile phone, host, or server, to perform various functions). This definition of "circuitry" applies to all uses of this term in this application, including in any claims. As a further example, as used in this application and if applicable to the particular context, the term "circuitry" would also cover an implementation of merely a processor (or multiple processors) and its (or their) accompanying software/or firmware. The term "circuitry" would also cover if applicable to the particular context, for example, a baseband integrated circuit or applications processor integrated circuit in a mobile phone or a similar integrated circuit in a cellular network device or other network devices.

Pertinent internal components of the telephone include a Main Control Unit (MCU) 2103, a Digital Signal Processor (DSP) 2105, and a receiver/transmitter unit including a microphone gain control unit and a speaker gain control unit. A main display unit 2107 provides a display to the user in support of various applications and mobile terminal functions that perform or support the steps as described herein. The display 2107 includes display circuitry configured to display at least a portion of a user interface of the mobile terminal (e.g., mobile telephone). Additionally, the display 2107 and display circuitry are configured to facilitate user control of at least some functions of the mobile terminal. An audio function circuitry 2109 includes a microphone 2111 and microphone amplifier that amplifies the speech signal output from the microphone 2111. The amplified speech signal output from the microphone 2111 is fed to a coder/decoder (CODEC) 2113.

A radio section 2115 amplifies power and converts frequency in order to communicate with a base station, which is included in a mobile communication system, via antenna 2117. The power amplifier (PA) 2119 and the transmitter/modulation circuitry are operationally responsive to the MCU 2103, with an output from the PA 2119 coupled to the duplexer 2121 or circulator or antenna switch, as known in the art. The PA 2119 also couples to a battery interface and power control unit 2120.

In use, a user of mobile terminal 2101 speaks into the microphone 2111 and his or her voice along with any detected background noise is converted into an analog voltage. The analog voltage is then converted into a digital signal through the Analog to Digital Converter (ADC) 2123. The control unit 2103 routes the digital signal into the DSP 2105 for processing therein, such as speech encoding, channel encoding, encrypting, and interleaving. In one embodiment, the processed voice signals are encoded, by units not separately shown, using a cellular transmission protocol such as enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., microwave access (WiMAX), Long Term Evolution (LTE) networks, code division multiple access (CDMA), wideband code division multiple access (WCDMA), wireless fidelity (WiFi), satellite, and the like, or any combination thereof.

The encoded signals are then routed to an equalizer 2125 for compensation of any frequency-dependent impairments that occur during transmission though the air such as phase and amplitude distortion. After equalizing the bit stream, the modulator 2127 combines the signal with a RF signal generated in the RF interface 2129. The modulator 2127 generates a sine wave by way of frequency or phase modulation. In order to prepare the signal for transmission, an up-converter 2131 combines the sine wave output from the modulator 2127 with another sine wave generated by a synthesizer 2133 to achieve the desired frequency of transmission. The signal is then sent through a PA 2119 to increase the signal to an appropriate power level. In practical systems, the PA 2119 acts as a variable gain amplifier whose gain is controlled by the DSP 2105 from information received from a network base station. The signal is then filtered within the duplexer 2121 and optionally sent to an antenna coupler 2135 to match impedances to provide maximum power transfer. Finally, the signal is transmitted via antenna 2117 to a local base station. An automatic gain control (AGC) can be supplied to control the gain of the final stages of the receiver. The signals may be forwarded from there to a remote telephone which may be another cellular telephone, any other mobile phone or a land-line connected to a Public Switched Telephone Network (PSTN), or other telephony networks.

Voice signals transmitted to the mobile terminal 2101 are received via antenna 2117 and immediately amplified by a low noise amplifier (LNA) 2137. A down-converter 2139 lowers the carrier frequency while the demodulator 2141 strips away the RF leaving only a digital bit stream. The signal then goes through the equalizer 2125 and is processed by the DSP 2105. A Digital to Analog Converter (DAC) 2143 converts the signal and the resulting output is transmitted to the user through the speaker 2145, all under control of a Main Control Unit (MCU) 2103 which can be implemented as a Central Processing Unit (CPU) (not shown).

The MCU 2103 receives various signals including input signals from the keyboard 2147. The keyboard 2147 and/or the MCU 2103 in combination with other user input components (e.g., the microphone 2111) comprise a user interface circuitry for managing user input. The MCU 2103 runs a user interface software to facilitate user control of at least some functions of the mobile terminal 2101 as described herein. The MCU 2103 also delivers a display command and a switch command to the display 2107 and to the speech output switching controller, respectively. Further, the MCU 2103 exchanges information with the DSP 2105 and can access an optionally incorporated SIM card 2149 and a memory 2151. In addition, the MCU 2103 executes various control functions required of the terminal. The DSP 2105 may, depending upon the implementation, perform any of a variety of conventional digital processing functions on the voice signals. Additionally, DSP 2105 determines the background noise level of the local environment from the signals detected by microphone 2111 and sets the gain of microphone 2111 to a level selected to compensate for the natural tendency of the user of the mobile terminal 2101.

The CODEC 2113 includes the ADC 2123 and DAC 2143. The memory 2151 stores various data including call incoming tone data and is capable of storing other data including music data received via, e.g., the global Internet. The software module could reside in RAM memory, flash memory, registers, or any other form of writable storage medium known in the art. The memory device 2151 may be, but not limited to, a single memory, CD, DVD, ROM, RAM, EEPROM, optical storage, magnetic disk storage, flash memory storage, or any other non-volatile storage medium capable of storing digital data.

An optionally incorporated SIM card 2149 carries, for instance, important information, such as the cellular phone number, the carrier supplying service, subscription details, and security information. The SIM card 2149 serves primarily to identify the mobile terminal 2101 on a radio network. The card 2149 also contains a memory for storing a personal telephone number registry, text messages, and user specific mobile terminal settings.

In some embodiments, the mobile terminal 2101 includes a digital camera comprising an array of optical detectors, such as charge coupled device (CCD) array 2165. The output of the array is image data that is transferred to the MCU for further processing or storage in the memory 2151 or both. In the illustrated embodiment, the light impinges on the optical array through a lens 2163, such as a pin-hole lens or a material lens made of an optical grade glass or plastic material. In the illustrated embodiment, the mobile terminal 2101 includes a light source 2161, such as a LED to illuminate a subject for capture by the optical array, e.g., CCD 2165. The light source is powered by the battery interface and power control module 2120 and controlled by the MCU 2103 based on instructions stored or loaded into the MCU 2103.

Other aspect of the invention with respect to the measurement device 10 and its data processing and display capabilities are shown. More specifically, one or more of the modules 24, and preferably the control module 24C is configured to process data as it relates to power usage. In a preferred embodiment, power usage data can be displayed on a real time basis, wherein the data represents power usage of a selected unit over a selected period of time relative to and/or up to a time at which the data is requested at the measurement device 10. Accordingly, the data and/or information is shown on the display device 46 for viewing by a user and according to the input commands entered at the input mechanism 51. In this embodiment, the input mechanism 51 includes keypads 51A-51D. The inventors believe that this particular feature is not disclosed in prior art measurement devices.

The term "unit" as used herein may mean any selected area within a building, any selected piece of equipment or other device or are electrically connected to the device 10 for power monitoring. The term "time period" shall mean any selected time increment immediately preceding a time at which the unit and time period are selected to display power usage data.

With respect to FIGS. 22A-22D, the user interface assembly 20 with the display device 46 and input mechanism 50 are shown according to aspects of the invention as they relate to the display of data representing power usage. In these examples data representing power usage of a selected unit, appliance, device, piece of equipment building section or area or the like. For example, FIG. 22A a chiller has been selected for viewing power usage of this piece of equipment over the last hour.

Figure 22A:
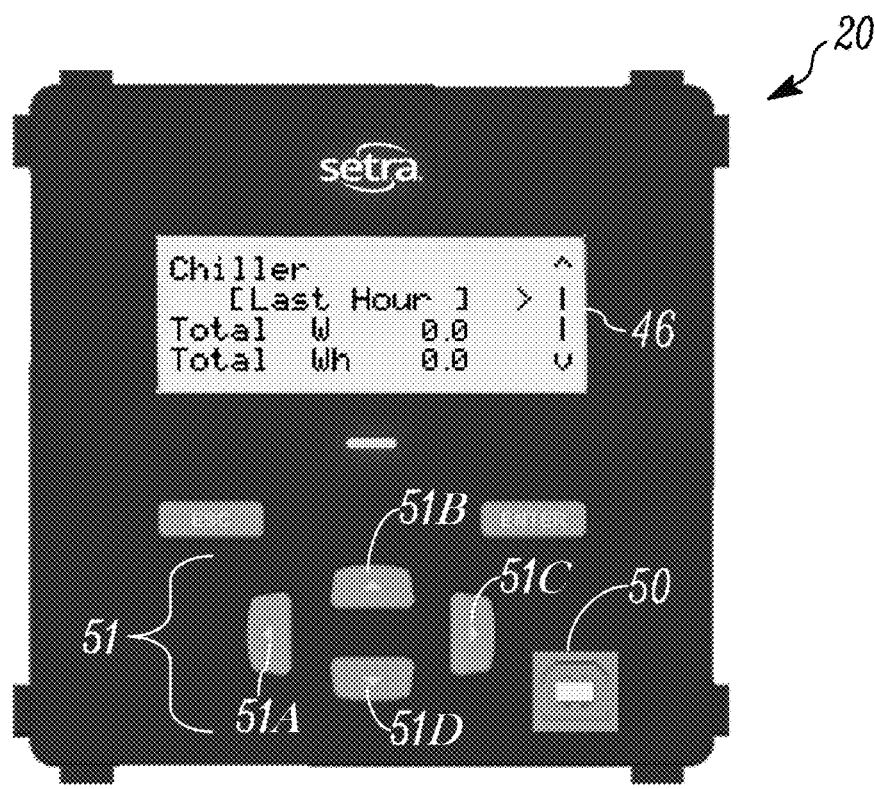
FIG. 22A-22D are illustrations of the measurement device displaying information as it relates to the display of data representing power usage according to aspects of the invention.
Figure 22B:
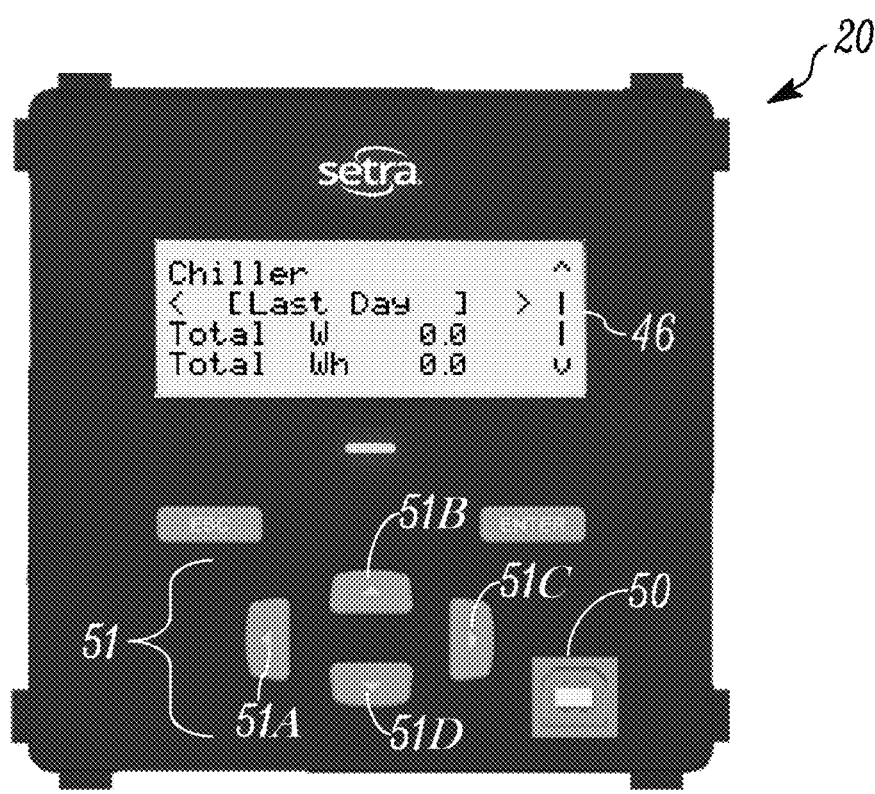
Figure 22C:
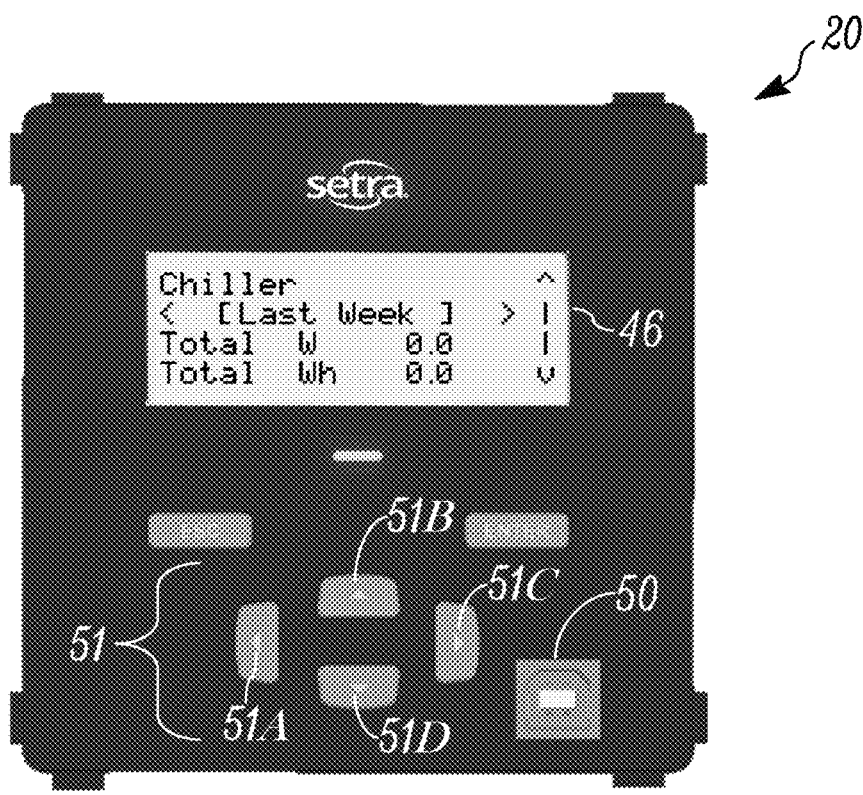
Figure 22D:
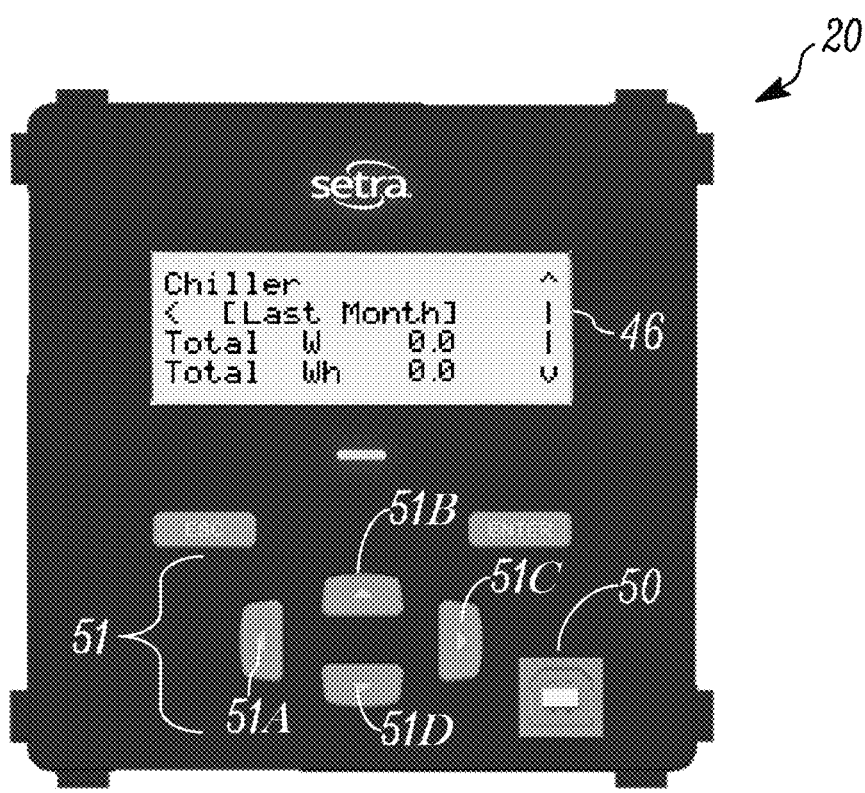

With respect to FIG. 22B, the keypad 51C has been actuated to select a next consecutive time period of the day or last twenty-fours. As shown, the power usage of the chiller over the time period of the previous twenty-hours is displayed. With respect to FIG. 22C, with keypad 51C actuated again, the power usage of the chiller over the past week is displayed; and with respect to FIG. 22D, with the keypad 51C having been actuated, the power usage of the chiller over the time period of a past month is displayed.

Figure 23:
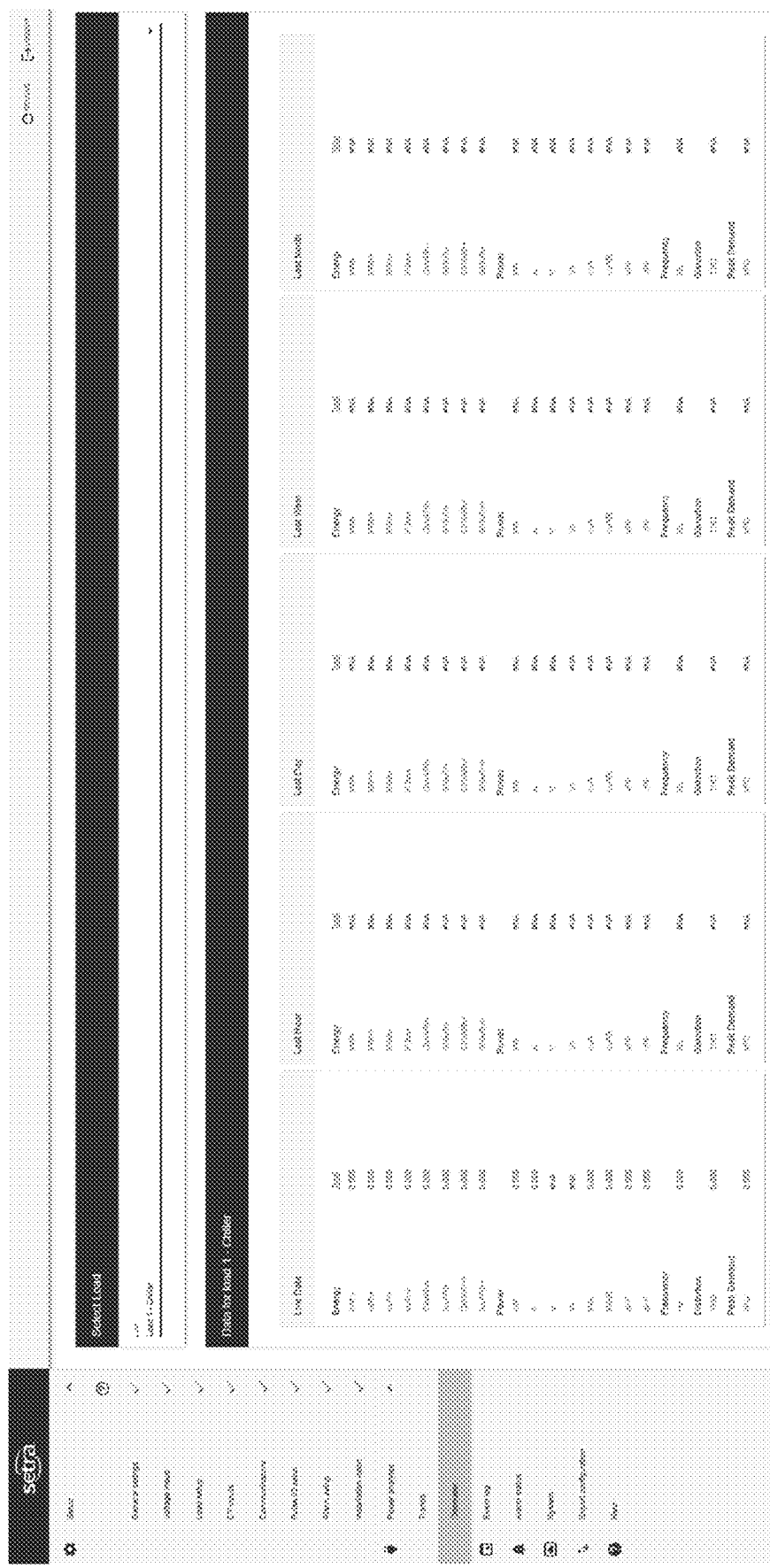
FIG. 23 is an exemplary screenshot of a GUI in accordance aspects of the invention.

Referring to FIG. 23, a measurement device 10 may at least one of store, transmit, and receive a plurality of values associated with a at least one of the plurality of voltage inputs, the plurality of current inputs, and the plurality of loads of the measurement device. In some embodiments, the measurement device 10 may store the plurality of values for a period of time. As an example, the period of time may be the preceding hour, the preceding day, the preceding month, or the preceding year. In some embodiments, one of the values may be a combination of other values over the period of time. As an example, the plurality of values may include at least one of volts, amps, watts, apparent power, reactive power, watt hours, apparent and displacement power factors, partial discharge, total harmonic distortion, and other parameters. As an example of a value that is a combination of other values, watts are representative of power which is calculated combining volts and amps. In those examples, the measurement device 10 may store the volts, amps, and watts over the predetermined period of time. As a further illustration, a user may want to know what the volts have been for every hour for the past year. The user may specify on at least one of the remote terminal and the measurement device which values they which to see and for what period of time.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. Throughout this specification and the claims, unless the context requires otherwise, the word "comprise" and its variations, such as "comprises" and "comprising," will be understood to imply the inclusion of a stated item, element or step or group of items, elements or steps but not the exclusion of any other item, element or step or group of items, elements or steps. Furthermore, the indefinite article "a" or "an" is meant to indicate one or more of the item, element or step modified by the article.

What is claimed is:
1. A measurement system, comprising:
a housing including a back housing and a front housing connected to, and separable from, the back housing, which is configured for mounting the measurement system to a support structure, wherein the back housing and the front housing define an interior volume;

a base frame disposed in the housing and forming a first volume, defined, at least in part, by the back housing and the base frame, and a second volume defined, at least in part, by the front housing and the base frame, wherein the base frame is disposed between a first voltage within the first volume and at least one of the second volume and an exterior to the housing when the front housing is separated from the back housing; wherein the first voltage is supplied by an external power source and through the back housing;

one or more first electrical connectors mounted to the back housing within the first volume, whereby the one or more first electrical connectors are connected to the external power source;

a user interface assembly mounted to the base frame and accessible from the exterior through the front housing, whereby a user interacts with the user interface assembly when the front housing is in a closed position relative to the back housing;

an interconnection module mounted to the base frame between the first and second volumes and electrically connected to the first voltage; and a control module on the base frame connected to the interconnection module in the second volume and connected to the first voltage and power supply via the interconnection module.

2. The measurement device of claim 1 wherein the user interface assembly includes a communications port facing an exterior of the housing and accessible from the exterior of the housing when the front housing is in a closed position relative to the back housing.

3. The measurement device of claim 1, wherein the base frame, with the interconnection module, control module and user interface assembly mounted thereon, are removable from the housing as an assembled unit while the external power source is connected to the measurement device.

4. The measurement device of claim 1, further comprising a power supply module mounted to the base frame and connected to the first voltage and the interconnection module in the first volume.

5. The measurement device of claim 4, wherein the base frame, with the interconnection module, control module, power supply module and user interface assembly mounted thereon, are removable from the housing as an assembled unit while the external power source is connected to the measurement device.

6. The measurement device of claim 1, wherein the user interface assembly includes a user interface module connected to the interconnection module in the second volume and a user interface device operatively connected to the user interface module and the user interface device faces the exterior of the housing and is accessible from the exterior of the housing when the front housing is in a closed position.

7. The measurement device of claim 6, further comprising a power supply module mounted to the base frame and connected to the first voltage and the interconnection module in the first volume.

8. The measurement device of claim 7, wherein the base frame, with the interconnection module, control module, power supply module and user interface assembly mounted thereon, are removable from the housing as an assembled unit while the external power source is connected to the measurement device.

9. A measurement system, comprising:
a housing including a back housing and a front housing connected to, and separable from, the back housing and the back housing is configured for mounting the measurement device to a support structure in a plurality of different orientations for receiving an external power source through an opening of the back housing and depending on an orientation of the external power source relative to the opening;

a base frame disposed in the housing;

one or more first electrical connectors mounted to the back housing, whereby the one or more first electrical connectors are connected to the external power source;

an interconnection module mounted to the base frame and in electrical connection with the first electrical connectors; the interconnection module comprising at least one receiving connector; and a user interface assembly comprising a user interface module which includes a plurality of connectors axially spaced along a periphery of the user interface module, wherein at least one of the plurality of connectors is in mating connection with the receiving connector when the user interface assembly is secured to the base frame, whereby the user interface assembly remains in a same orientation regardless of the orientation of the back housing and the at least one receiving connector relative to the orientation of the external power source.

10. The measurement device of claim 9, wherein the user interface assembly is accessible from an exterior to the housing and through the front housing so that a user may interact with the user interface assembly when the front housing is in a closed position relative to the back housing.

11. The measurement device of claim 10, wherein the user interface assembly includes a communications port facing the exterior to the housing and accessible from the exterior when the front housing is in a closed position relative to the back housing.

12. The measurement device of claim 9, wherein the base frame is disposed in the housing forming a first volume, defined, at least in part, by the back housing and the base frame, and a second volume defined, at least in part, by the front housing and the base frame, and the measurement device further comprising:

the interconnection module mounted to the base frame between the first and second volumes and electrically connected to a first voltage;

a control module on the base frame connected to the interconnection module in the second volume and connected to the first voltage and a power supply via the interconnection module; and, wherein the user interface module is connected to the interconnection module in the second volume.

13. The measurement device of claim 12 wherein the user interface assembly includes a communications port facing an exterior to the housing and is accessible from the exterior when the front housing is in a closed position relative to the back housing.

14. The measurement device of claim 12, wherein the base frame, with the interconnection module, control module and user interface assembly mounted thereon, are removable from the housing as an assembled unit while the external power source is connected to the measurement device.

15. The measurement device of claim 14, further comprising a power supply module mounted to the base frame and connected to the first voltage and the interconnection module in the first volume.

16. The measurement device of claim 15, wherein the base frame, with the interconnection module, control module, power supply module and user interface assembly mounted thereon, are removable from the housing as an assembled unit while the external power source is connected to the measurement device.

17. The measurement device of claim 12, wherein the user interface assembly is accessible from an exterior to the housing and through the front housing so that a user may interact with the user interface assembly when the front housing is in a closed position relative to the back housing.

18. The measurement device of claim 17, wherein the user interface assembly includes a communications port facing the exterior to the housing and accessible from the exterior when the front housing is in a closed position relative to the back housing.

19. The measurement device of claim 9, further comprising a power supply module mounted to the base frame and connected to the first voltage and the interconnection module in the first volume.

20. The measurement device of claim 9, wherein the user interface assembly further comprises a display operatively connected to the user interface module.

21. The measurement device of claim 9, further comprising a user interface device including one or more input mechanisms.

22. The measurement device of claim 21, wherein the user interface assembly further comprises a display operatively connected to the user interface module.

23. A measurement system, comprising:
 a housing including a back housing and a front housing connected to, and separable from, the back housing and the back housing is configured for mounting the measurement system to a support structure, and an opening in in the back housing through which an external power source is provided;
 a base frame disposed in the housing and having a first side facing the back housing and a second side facing the front housing,
 at least one first electrical connector mounted to the back housing configured for electrical connection to the external power source;
 an interconnection module mounted to the base frame, wherein the interconnection module comprises at least one first receiving connector disposed on the first side of the frame and at least one second receiving connector disposed on the second side of the frame;
 a power supply module on the first side of the base frame connected in mating relation to the first receiving connector;
 a control module on the second side of the base frame connected in mating relation to the second receiving connector and in electrical communication with the power supply module; and
 a user interface assembly on the second side of the base frame and in electrical communication with the control module; and,
 wherein the base frame, with the interconnection module, control module, power supply module and user interface assembly mounted thereon, are removable from the housing as an assembled unit while the external power source is connected to the measurement device via the first electrical connector.

24. The measurement device of claim 23, wherein the user interface assembly comprises a display operatively connected to the user interface module and one or more input mechanism, wherein in the display and one or more input mechanisms face an exterior to the housing and at least the one or more input mechanisms are accessible from the exterior when the front housing is in a closed position relative to the back housing.

25. The measurement device of claim 23 wherein the user interface assembly includes a communications port facing an exterior to the housing that is accessible from the exterior when the front housing is in a closed position relative to the back housing.

* * * * *